United States Patent
Takahashi et al.

[11] Patent Number: 5,463,238
[45] Date of Patent: Oct. 31, 1995

[54] CMOS STRUCTURE WITH PARASITIC CHANNEL PREVENTION

[75] Inventors: Kunihiro Takahashi; Masaaki Kamiya; Yoshikazu Kojima; Hiroaki Takasu, all of Tokyo, Japan

[73] Assignee: Seiko Instruments Inc., Japan

[21] Appl. No.: 22,369

[22] Filed: Feb. 25, 1993

[30] Foreign Application Priority Data

Feb. 25, 1992 [JP] Japan .................. 4-037917
Jun. 3, 1992 [JP] Japan .................. 4-142884

[51] Int. Cl.[6] ............... H01L 27/02; H01L 21/225; H01L 29/06
[52] U.S. Cl. ........... 257/351; 257/374; 257/507; 257/509; 257/630
[58] Field of Search ............. 257/347–354, 257/630, 66, 67, 507, 509

[56] References Cited

U.S. PATENT DOCUMENTS

| | | | |
|---|---|---|---|
| 3,783,052 | 1/1974 | Fisher | 257/352 |
| 4,725,875 | 2/1988 | Hsueh | 257/351 |
| 4,753,896 | 6/1988 | Matloubian | 257/350 |
| 4,816,893 | 3/1989 | Mayer et al. | 257/349 |
| 4,819,052 | 4/1989 | Hutter | 257/630 |
| 5,081,062 | 1/1992 | Vasudev et al. | 257/347 |
| 5,164,803 | 11/1992 | Ozaki et al. | 257/630 |

FOREIGN PATENT DOCUMENTS

| | | | |
|---|---|---|---|
| 57-102067 | 6/1982 | Japan | 257/350 |
| 01268063 | 10/1989 | Japan | 257/347 |

*Primary Examiner*—Mahshid D. Saadat
*Attorney, Agent, or Firm*—Adams & Wilks

[57] ABSTRACT

A semiconductor device comprises a complementary MOS transistor integrated circuit formed in a semiconductor single crystal silicon disposed on an electrically insulating layer. A thickness of the single crystal silicon in a region in which an N-type MOS transistor is formed is made thicker than the thickness in a region in which a P-type MOS transistor is formed. By this structure, the bottoms of the source region and the drain region of the N-type transistor are separated from the electrically insulating layer by a predetermined distance. The separation of the source region and the drain region from the electrically insulating layer is effective to prevent a parasitic channel from forming, thereby reducing leakage current and making the semiconductor device more efficient.

27 Claims, 13 Drawing Sheets

5,463,238

CMOS STRUCTURE WITH PARASITIC CHANNEL PREVENTION

BACKGROUND OF THE INVENTION

The present invention relates to a semiconductor device. In particular, it relates to a semiconductor device which is called semiconductor silicon on an insulator, namely SOI (Silicon On Insulator). The semiconductor silicon on the insulator is called SOI hereinafter for simplification.

FIG. 2 shows a cross-sectional structure of a SOI wafer. 21 is a thick single crystal silicon substrate, 22 is a silicon oxide film SiO having a thickness of several hundred Å to several μm, and 23 is a thin single crystal silicon layer having a thickness of several hundred Å to several μm. In the SOI wafer, electric elements such as transistors, resistors, capacitors and the like are formed on the thin single crystal silicon layer 23.

By the way, the present invention relates to a semiconductor device formed on semiconductor single crystal silicon on an electrically insulating substance formed as a layer on the whole face of the thick single crystal silicon substrate 21 using at least a complementary type metal/insulator semiconductor transistor integrated circuit (complementary type MIS transistor). The MIS transistor refers to a transistor of the electric field effect type in which a certain type of insulation film (for example, a silicon nitride film single layer, multiple layers of the silicon nitride film and the silicon oxide film and the like), which is not limited to the silicon oxide film, is used for a gate insulation film. In the following explanation of the present invention, the explanation will be made using the metal/oxide film/semiconductor transistor (MOS transistor) which is most general in the MIS transistor as an example. Even when the MOS transistor is used to explain in the explanation, the MIS transistor is generally described.

FIG. 3 shows a cross-sectional structure of a partial portion of a conventional complementary type MOS integrated circuit (hereinafter referred to as CMOSIC) formed on a SOI wafer. 31 indicates a single crystal silicon substrate, 32 indicates a silicon oxide film (hereinafter abbreviated as BOX (Buried Oxide: abbreviation of the buried oxide film) having a thickness of several hundred Å to several μm, 33 and 34 indicate a source and a drain of an N-type MOS transistor respectively, 35 indicates a gate electrode comprising polycrystalline silicon, 36 indicates a gate insulator comprising a silicon oxide film, and 37 indicates a P well comprising a P-type impurity having a low concentration. The N-type MOS transistor is formed by the source 33, the drain 34, the gate electrode 35, the gate insulator 36 and the P well 37. 38 and 39 indicate a source and a drain of a P-type MOS transistor, 310 indicates a gate electrode comprising polycrystalline silicon, 311 indicates a gate insulation film comprising a silicon oxide film, 312 indicates an N well comprising an N-type impurity having a dilute concentration. The P-type MOS transistor is formed by the source 38, the drain 39, the gate electrode 310, the gate insulator 311 and the N well 312.

In FIG. 3, 313 indicated at three places is a thick silicon oxide SiO₂ for isolation (hereinafter referred to as the field oxide).

In FIG. 3, in the CMOSIC formed on the conventional SOI wafer, the bottoms of the source 33 and the drain 34 of the N-type MOS transistor and the source 38 and the drain 39 of the P-type MOS transistor have contacted with the BOX 32.

FIG. 4 shows distribution of the boron concentration as the P-type impurity for forming the P well in the depth direction of the BOX 32 and the P well on the straight line A—A' shown in FIG. 3.

As clarified from FIG. 4, at the boundary between the BOX 32 and the P well as the single crystal silicon layer, due to the segregation of boron, the concentration of boron rapidly decreases at the side of the single crystal silicon layer. Thus, the region of 314 shown in FIG. 3 contacting with the BOX 32 of the P well 37 has an extremely low concentration of boron, which becomes a region in which a current passage of the N-type MOS transistor is apt to be formed.

Thus, in the N-type MOS transistor of the CMOSIC shown in FIG. 3, a parasitic channel is subject to occur in the region 314, and the leak current will become extremely large.

On the other hand, FIG. 5 shows distribution of the phosphorus concentration as the N-type impurity for forming the N well in the depth direction of the BOX 32 and the N well on the straight line B—B' shown in FIG. 3.

As clarified from FIG. 5, at the boundary between the BOX 32 and the N well as the single crystal silicon layer, due to the segregation of phosphorus, the concentration of phosphorus increases at the side of the single crystal silicon layer. Thus, the concentration of phosphorus is relatively high in the region of 315 shown in FIG. 3 contacting with the BOX 32 of the N well 312, and the current passage is difficult to be formed in this region.

Thus, with respect to the P-type MOS transistor of the MOSIC shown in FIG. 3, it is difficult to generate the parasitic channel in the region 315, and hence the leak current is also small, showing good transistor characteristics.

As explained above, in the CMOSIC formed on the conventional SOI wafer, the bottoms of the source and the drain of the N-type MOS transistor contact with the BOX, so that at the boundary between the P well and the BOX in the N-type transistor, the parasitic channel is formed, the leak current is large, and good transistor characteristics are not obtained. Therefore, as characteristics of the CMOSIC, since the leak current is large, there has been a conventionally experienced drawback in that excellent CMOSIC characteristics, including low electric power consumption, are not obtained.

The present invention is directed to the CMOSIC formed on the SOI wafer, an object of which is to suppress the leak current of the N-type MOS transistor, and consequently obtain excellent characteristics inherent in a CMOSIC having low electric power consumption.

In addition, the thickness of the single crystal silicon layer on the electrically insulating substance in the semiconductor device of the present invention is thicker than the thickness of the single crystal silicon layer on the electrically insulating substance of the conventional structure shown in FIG. 3.

In the conventional semiconductor device having the structure shown in FIG. 3, no single crystal silicon layer is present under the field oxide film 313 as the isolation region, and the isolation between devices existing at both sides of the field oxide film 313 is complete owing to the fact that no current passage is present under the field oxide film.

On the other hand, in the semiconductor device of the present invention, the single crystal silicon layer remains at least under the field oxide film as the isolation region for interposing the region in which the N-type MOS transistor is formed. Thus, as compared with the conventional semiconductor device having the structure shown in FIG. 3, it has a drawback as having the structure in which the isolation is weak.

Thus, it is another object of the present invention to certainly perform the isolation even when the single crystal silicon layer remains in the element isolation region.

SUMMARY OF THE INVENTION

It is a feature of the present invention that when a CMOSIC is formed in thin single crystal silicon on an electrically insulating substance on an SOI wafer, the thickness of silicon is a region in which an N-type MOS transistor is formed is made thicker than the thickness of silicon of a region in which a P-type MOS transistor is formed.

In addition, in the present invention, when a complementary type metal/insulation film/semiconductor transistor integrated circuit (complementary type MIS transistor integrated circuit) is formed in thin single crystal silicon on an electrically insulating substance on an SOI wafer, there is provided a structure in which the bottoms of a source and a drain of an N-type MIS transistor are separated from the electrically insulating substance, so as not to form the parasitic channel.

Further, the impurity concentration in a single crystal silicon layer in an isolation region in the semiconductor device of the present invention is made higher than the impurity concentration in a single crystal silicon layer in a region in which the element is formed.

The major object of the present invention is that the thickness of silicon in a region in which an N-type MOS transistor is formed is made thick, thereby the bottoms of a source and a drain of the N-type MOS transistor do not contact with a BOX, and it is made difficult to generate the parasitic channel at the boundary of a P well and the BOX. In addition, it is intended not to generate the parasitic channel even when the silicon thickness in a region in which a P-type MOS transistor is formed is thin, and the bottoms of the source and the drain contact with the BOX. Thereby it is possible to obtain a CMOSIC in which no leak current is generated in both MOS transistors of the N-type and the P-type, and the electric power consumption is less. In addition, the impurity concentration in the single crystal silicon layer in the isolation region is made high, thereby the current passage is difficult to be generated therein, so as to realize certain isolation.

The outline of the constitution of the present invention and the effect thereby will be described hereinafter more concretely.

(1) In the complementary type MIS transistor integrated circuit formed on the SOI substrate, the thickness of silicon in the region in which the N-type MIS transistor is formed is made thicker than the thickness of silicon in the region in which the P-type MIS transistor is formed, and the bottom of the source or the drain electrode of the N-type MIS transistor is separated from the electrically insulating substance, thereby the complementary type MIS transistor integrated circuit can be provided in which the parasitic channel of the N-type MIS transistor is not generated, the leak current is less both in the N-type MOS transistor and the P-type MIS transistor, and the electric power consumption is less.

(2) In the complementary type MIS transistor integrated circuit formed on the SOI substrate, the thickness of silicon in the region in which the N-type MIS transistor is formed is made the same as the thickness of silicon in the region in which the P-type MIS transistor is formed, and the bottom of the source or the drain electrode of the N-type MIS transistor is separated from the electrically insulating substance, thereby the complementary type MIS integrated circuit can be provided with ease by the conventional CMOS process, in which the parasitic channel of the N-type MIS transistor is not generated at the boundary between the silicon and the electrically insulating substance, the leak current is less both in the N-type MIS transistor and the P-type MIS transistor, and hence the electric power consumption is less.

(3) There is provided such a structure in which the source or the drain of the N-type MIS transistor floats over the electrically insulating substance, thereby a negative voltage can be applied to the side of the P well, and the depletion layer formed in the P well of the N-type MIS transistor is widely enlarged, so that the parasitic capacitance is less, Thus, as compared with the complementary type MIS transistor integrated circuit formed on an ordinary single crystal silicon wafer, it is a matter of course that the speed is fast, and a speed can be obtained which is equivalent to that of the CMOSIC formed on the standard SOI wafer shown in FIG. 3.

(4) The bottom of the thick silicon oxide of the isolation portion for interposing the region of the P-type impurity having the low concentration in which the N-type transistor is formed is separated from the electrically insulating substance, so that the boron concentration in the P-type impurity region immediately under the bird's beak of the isolation portion is fairly higher than the boron concentration in the P-type impurity region immediately under the bird's beak in the case in which the bottom of the electrically insulating substance contacts with the BOX, thereby the parasitic channel is not generated at both end portions in the widthwise direction of the N-type MIS transistor.

(5) In the complementary type MIS transistor integrated circuit formed on the SOI substrate, when the thickness of silicon in the region in which the N-type MIS transistor is formed is the same as the thickness of silicon in the region in which the P-type MIS transistor is formed, the thickness of the single crystal silicon on the electrically insulating substance is not more than 4 µm, so that the single crystal silicon layer is not present at all, or if any, it is an extremely thin layer between the field oxide film for the element separation and the BOX comprising the silicon oxide layer, so that the carrier does not flow at all, or if any, it flows extremely a little under the field oxide film, so that the latch-up does not take place at all, or it becomes extremely difficult to take place.

(6) In the complementary type MIS transistor integrated circuit formed on the SOI substrate, when the thickness of silicon in the region in which the N-type MIS transistor is formed is made thicker than the thickness of silicon in the region in which the P-type MIS transistor is formed, a mask, which is used when the CMOSIC is formed on an ordinary single crystal silicon wafer other than the SOI wafer, can be exactly applied to the SOI wafer which has the structure of the present invention, and at this time, the thickness of silicon in the region in which the N-type MOS transistor is formed is formed to be thicker than the thickness of silicon in the region in which the P-type MOS transistor is formed, so that the distance between the electrically insulating substance and the portion at the side of the P-type MOS transistor of the isolation insulation layer for isolating the N-type MOS transistor and the P-type MOS transistor of the finished CMOSIC becomes short, thereby as compared with the CMOSIC formed on the ordinary single crystal silicon wafer, the latch-up can be made difficult to take place.

(7) In the semiconductor device of the present invention, the impurity concentration in the region of single crystal silicon (well region) under the field oxide in the isolation region or the thin insulation film is made high, and the structure is provided in which the surface of the single crystal silicon in the region is difficult to serve as the current passage, thereby the electric isolation between the adjoining transistors with interposing the isolation region can be realized with certainty.

(8) In the semiconductor device of the present invention, a voltage is applied to polycrystalline silicon or metal such as aluminum or the like provided on the field oxide film in the isolation region or the thin insulation film, thereby the surface of the single crystal silicon in the isolation region is made difficult to invert, and it is made difficult to serve as the current passage, thereby the electric isolation between the adjoining transistors with interposing the isolation region can be realized with certainty.

DETAILED DESCRIPTION OF THE PRESENT INVENTION

Figure 1:
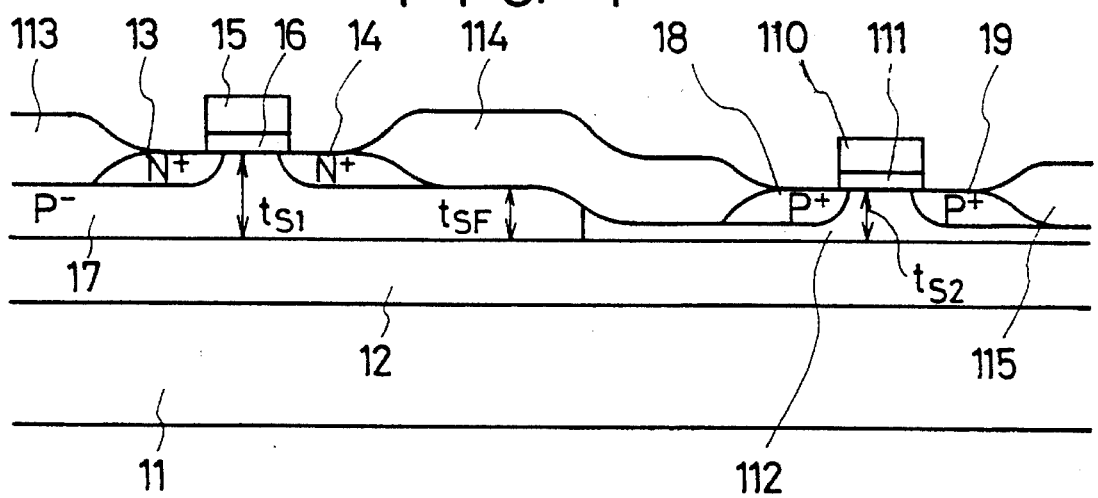
FIG. 1 shows the cross-sectional structure of the semiconductor device in accordance with the present invention.

FIG. 1 shows the cross-sectional structure of a partial portion of the CMOSIC formed on the SOI wafer of the present invention. 11 indicates a single crystal silicon substrate, 12 indicates a silicon oxide film having a thickness of several hundred Å to several μm, 13 and 14 indicate a source and a drain of an N-type MOS transistor respectively, 15 indicates a gate electrode comprising a silicon oxide $SiO_2$, and 17 indicates a P well comprising a P-type impurity of a low concentration.

The N-type MOS transistor is formed by the source 13, the drain 14, the gate electrode 15, the gate insulator 16 and the P well 17.

18 and 19 indicate a source and a drain region of a P-type MOS transistor respectively, 110 indicates a gate electrode comprising polycrystalline silicon, 111 indicates a gate insulator comprising a silicon oxide, and 112 indicates an N-well comprising an N-type impurity of a low concentration. The P-type MOS transistor in formed by the source 18, the drain 19, the gate electrode 110, the gate insulator 111 and the N well 112.

The silicon oxide $SiO_2$ is provided for isolation in which the formation is made up and designated as formed on the P well 17, 114 riding on both of the P well 17 and the N well 112, and 115 formed on the N well 113, respectively.

Figure 3:
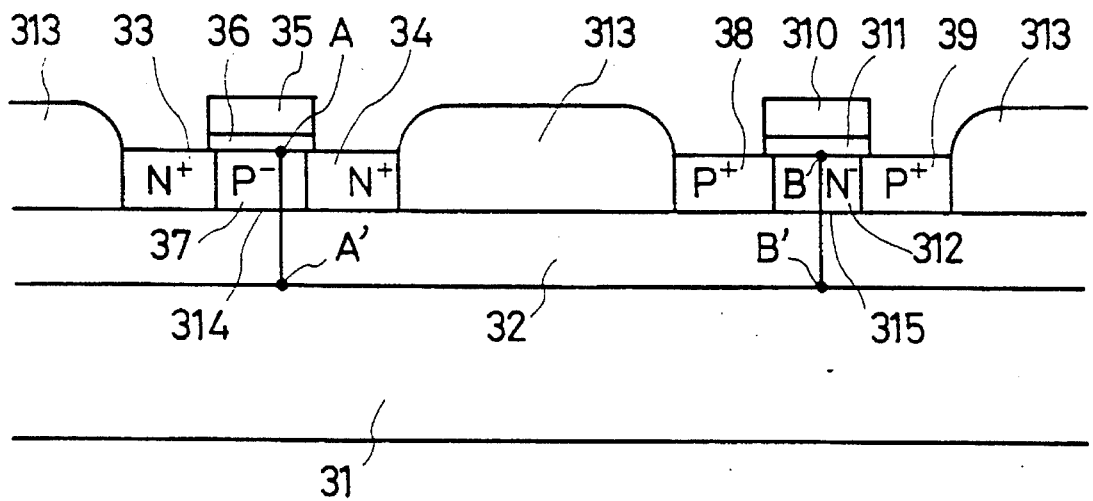
FIG. 3 shows the cross-sectional structure of the conductor device formed on the conventional SOI wafer.
Figure 4:
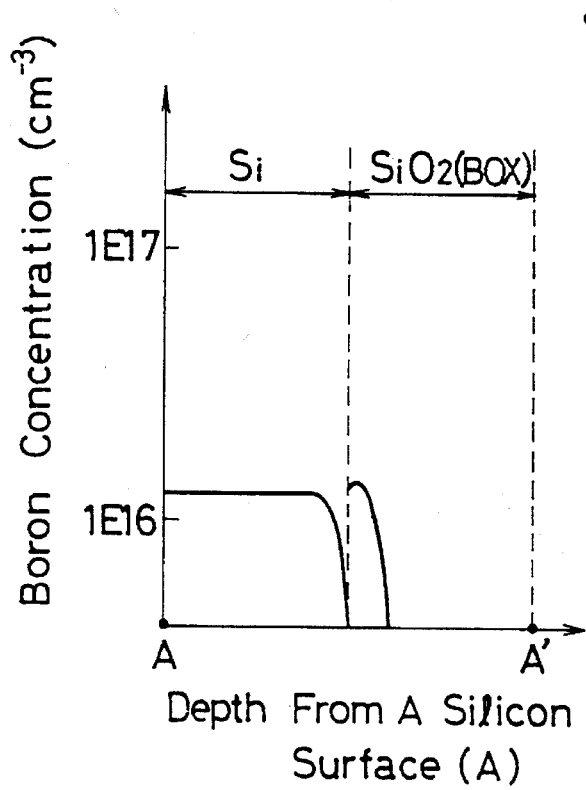
FIG. 4 is a graph showing the concentration distribution of boron in the SOI wafer forming the P well.
Figure 5:
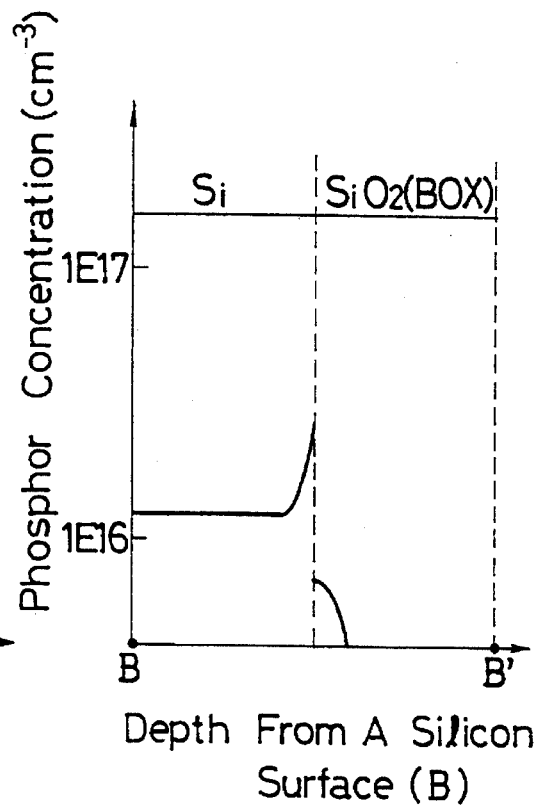
FIG. 5 is a graph showing the concentration distribution of phosphorous in the SOI wafer forming the N well.

In FIG. 1, the thickness $t_{S1}$ of the single crystal silicon in the region in which the N-type MOS transistor is formed is thicker than the thickness of $t_{S2}$ of the single crystal silicon in the region in which the P-type MOS transistor is formed. At the same time, the bottoms of the source 13 and the drain 14 of the N-type MOS transistor do not contact with the BOX 12. Thus, in the structure of the N-type MOS transistor of the present invention shown in FIG. 1, the parasitic channel generated at the boundary 314 between the BOX 32 and the P well as explained in FIG. 3 is not generated. In addition, in FIG. 1, the bottoms of the source 18 and the drain 19 of the P-type MOS transistor also do not contact with the BOX 12.

Figure 6:
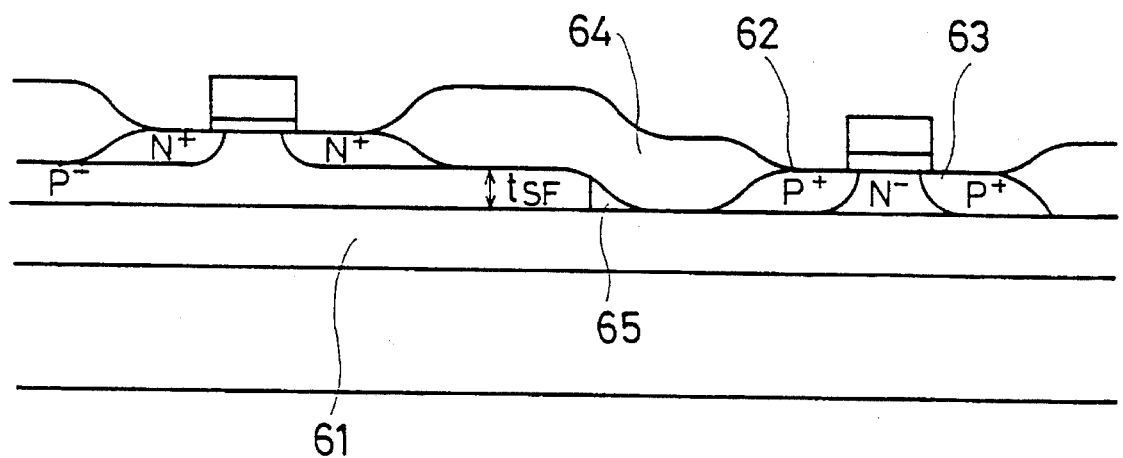
FIG. 6 shows a cross-sectional structure of the semiconductor device showing another example of the semiconductor device in accordance with the present invention.

FIG. 6 shows the cross-sectional structure of a partial portion of the CMOSIC formed on the SOI wafer as another example of the present invention. The features, in which the example of the present invention in FIG. 6 is different from the example of the present invention in FIG. 1, are only that in FIG. 6, the bottoms of a source 62 and a drain 63 of the P-type MOS transistor contact with a silicon oxide film (BOX) 61, and the bottom existing at the N well side of a field oxide 64 also contacts with the BOX 61, and the other portions have completely the same structure. In addition, a slight region of 65 is the N well, namely the N-region.

In the P-type MOS transistor, whether or not the bottoms of the source electrode and the drain electrode contact with the BOX, the parasitic channel is not generated, so that also in the structure of the present invention in FIG. 1 as well as in the structure of the present invention in FIG. 6, both of the N-type MOS transistor and the P-type MOS transistor have less leak current, and the CMOSIC of less electric power consumption can be obtained with any one of the structures.

In accordance with the cross-sectional views in the order of production steps shown in FIG. 7(a) to (c) and FIG. 8(a) to (c), it is intended to show the method for forming the semiconductor device of the present invention in which the thickness of the single crystal silicon layer in the region for forming the N-type MOS transistor is different from that for the P-type MOS transistor.

Figure 7A:
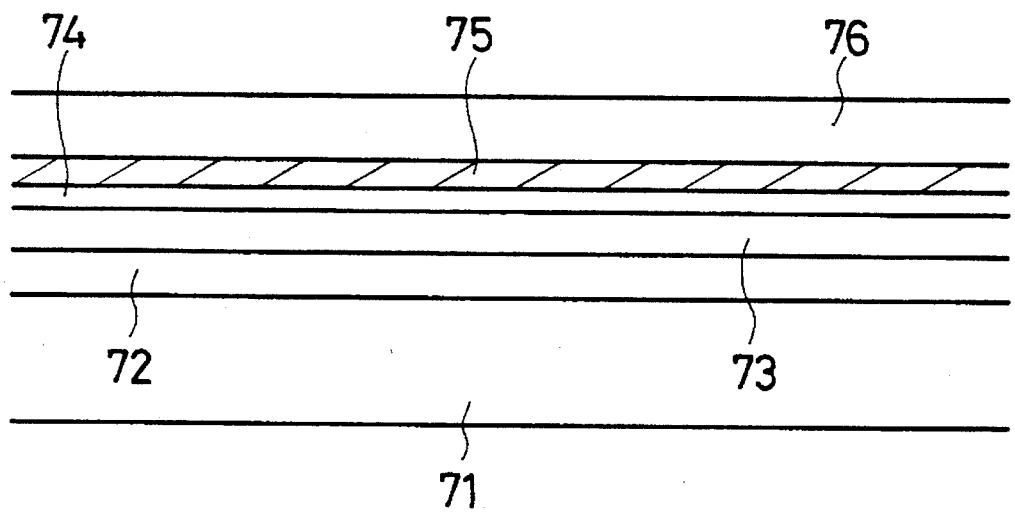
FIGS. 7(a)–(c) show cross-sectional views showing part of the production steps of the semiconductor device in accordance with the present invention in (a) to (c)

In FIG. 7(a), 71 indicates a single crystal silicon substrate, 72 indicates a silicon oxide having a thickness of several hundred Å to several μm, and 73 indicates single crystal silicon having a thickness of several hundred Å to several μm in the same manner. The SOI wafer is formed by 71, 72 and 73. 74 indicates a silicon oxide having a thickness of several hundred Å formed by oxidizing the surface of the single crystal silicon 73, and 75 indicates a silicon nitride deposited by the chemical vapor deposition (hereinafter abbreviated as CVD). 76 indicates a resist applied on the silicon nitride film.

Figure 7B:
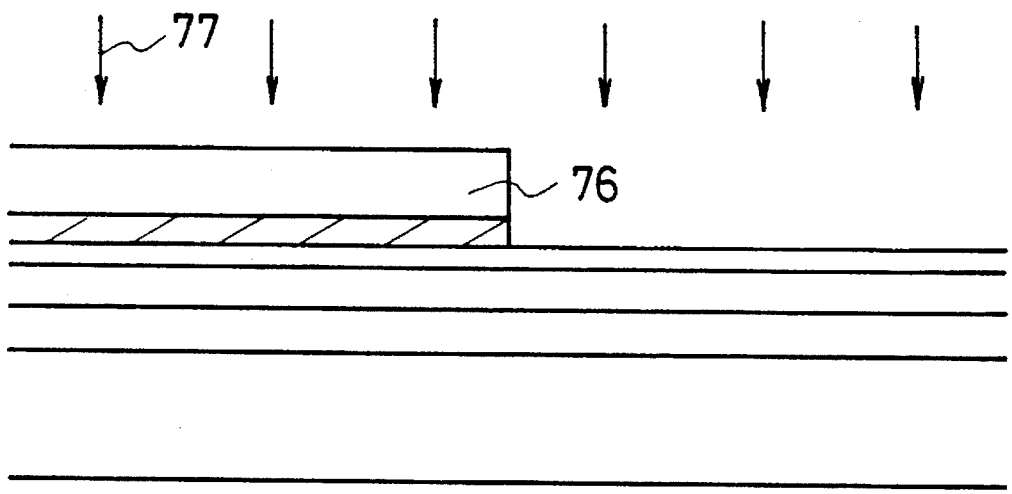

In FIG. 7(b), the resist film on the region in which the N well is formed by the exposure and development step, namely the region in which the P-type MOS transistor is formed is removed, and then the silicon nitride film 75 is subjected to etching by means of the dry etching. And then ion implantation of an N-type impurity 77 such as phosphorus or arsenic is performed for forming the N-well. In the left half in FIG. 7(b), namely on the region in which the P well is formed, the resist 76 remains, and the N-type impurity 77 for the formation of the N well does not enter the single crystal silicon 73 in the region.

Figure 7C:
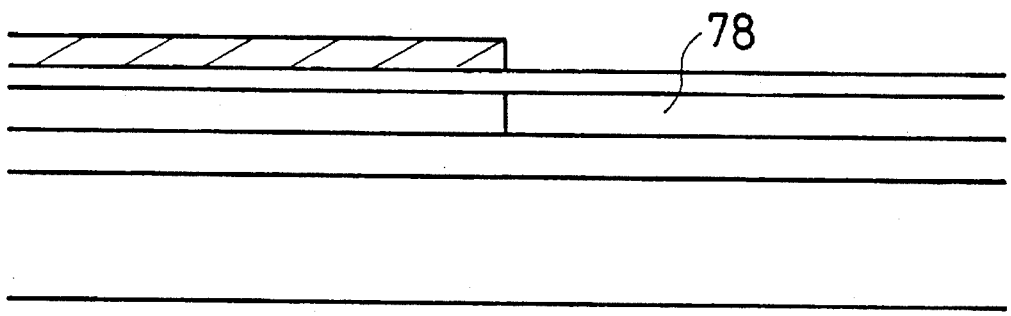

In FIG. 7(c), the resist 76 remained in FIG. 7(b) is removed. In addition, in the single crystal silicon 73, in the region in which the N well of the right half of the same figure is formed, the N-type impurity having been subjected to ion implantation in FIG. 7(b) is included, and an N well 78 is formed.

Figure 8A:
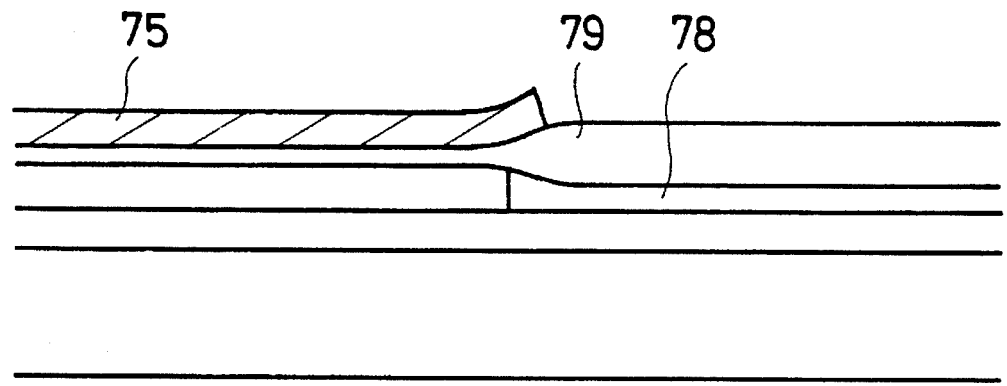
FIGS. 8(a)–(c) show cross-sectional views showing part of the production steps of the semiconductor device of the present invention in (a) to (c)
Figure 8B:
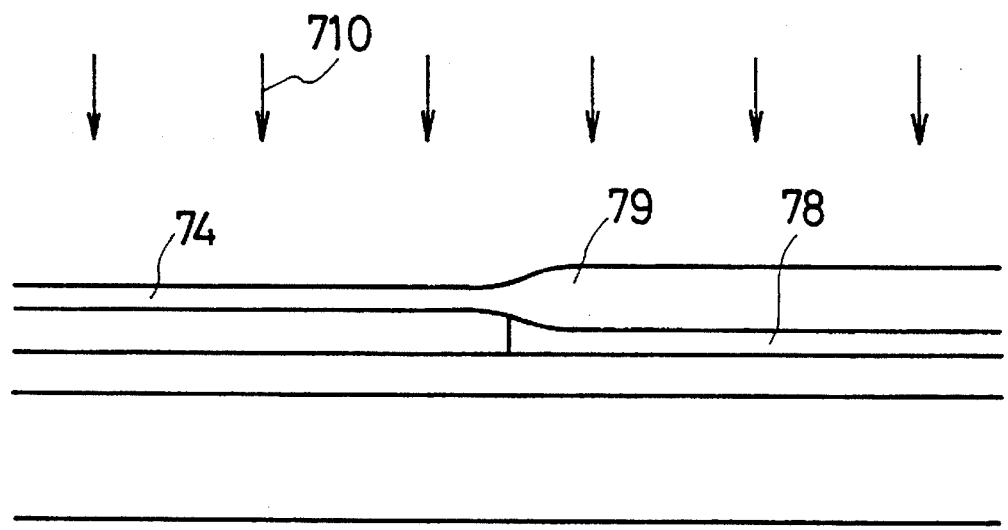

In FIG. 8(a), the single crystal silicon layer 73 in the N well region at the right half in the same figure is oxidized, so as to form a silicon oxide 79 having a thickness of several thousand Å. In FIG. 8(b), the remaining silicon nitride film 75 is removed, and then ion implantation of a P-type impurity 710 for the formation of a P well is performed. At this time, the thick silicon oxide 79 is present on the N well region 78 having been formed, so that the P-type impurity 78 subjected to ion implantation does not enter the N well region 78.

Figure 8C:
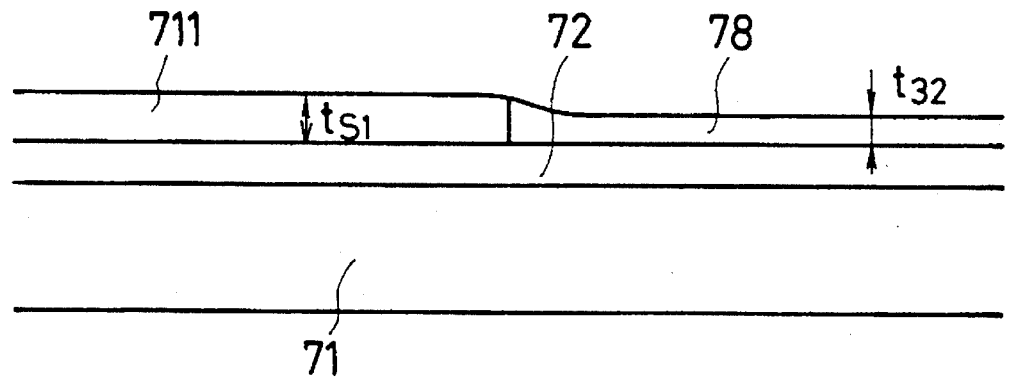

In FIG. 8(c), when annealing is performed in a nitrogen atmosphere at 900° C. to 1200° C., and thereafter the silicon oxide 74 and 79 are removed, then the P well 711 and the N well 78 having an approximately uniform concentration in the depth direction are formed. Further, the thickness of the single crystal silicon layer in the region 711 of the P well, that is the region in which the N-type MOS transistor is formed is $t_{S1}$, and this thickness is formed to be thicker than the thickness $t_{S2}$ of the single crystal silicon layer in the region in which the P-type MOS transistor is formed.

As shown in the steps in FIG. 7(a) to (c) and FIG. 8(a) to (c), in accordance with the production method of the present invention in which the N well and the P well are formed by one time of exposure and development step, as compared with the method in which two times of ion implantation for the N well and the P well are performed during exposure and development steps corresponding thereto respectively, namely the formation of the N well and the P well is performed by total two times of exposure and development steps, there is provided an advantage that the alignment error of the N well and the P well by the mask becomes extremely less.

Figure 9:
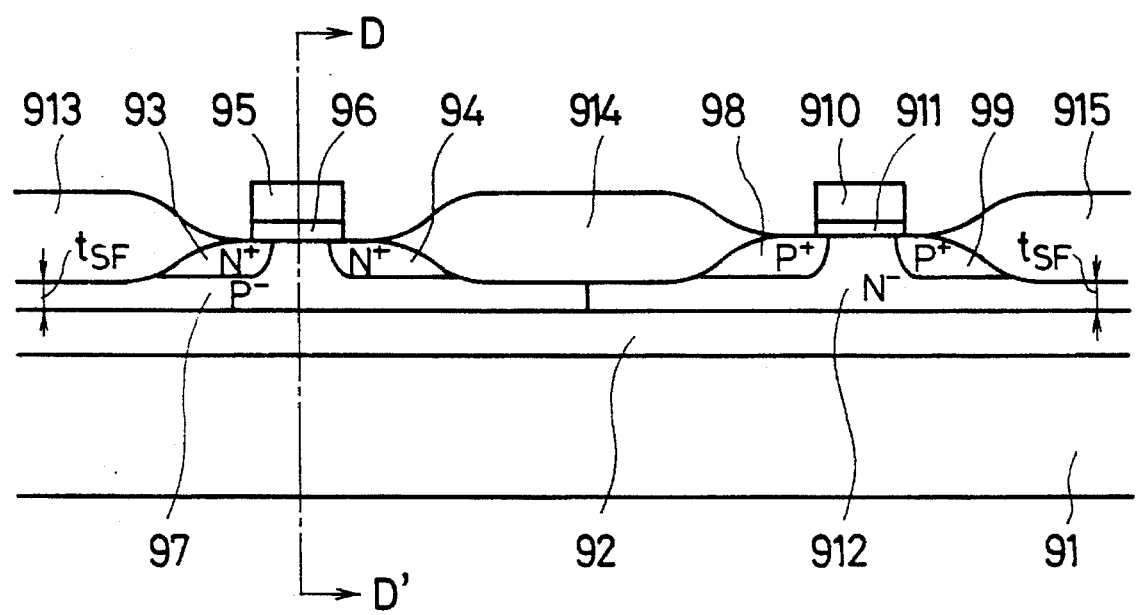
FIG. 9 shows the cross-sectional structure of the semiconductor device in accordance with the present invention.

FIG. 9 is a figure of cross-sectional structure of a partial portion of the CMOSIC formed on the SOI wafer showing one example of the present invention. The examples of the present invention shown in FIG. 1 and FIG. 6 are different from the example of the present invention shown in FIG. 9 in that in the example shown in FIG. 9, the thickness of single crystal silicon in the region in which the N-type MOS transistor is formed is the same as the thickness of single crystal silicon in the region in which the P-type MOS transistor is formed. 91 is a single crystal silicon substrate having a thickness of 500 to 700 μm, 92 is a silicon oxide having a thickness of several hundred Å to several μm, 93 and 94 are a source and a drain of an N-type MOS transistor being capable of control to be a depth of 0.3 to 0.5 μm, 95 indicates a gate electrode comprising polycrystalline silicon, 96 indicates a gate insulator comprising a silicon oxide $SiO_2$, and 97 indicates a P well comprising a P-type impurity of a low concentration. The N-type MOS transistor is formed by the source 93, the drain 94, the gate electrode 95, the gate insulator 96 and the P well 97.

98 and 99 indicate a source and a drain of a P-type MOS transistor respectively, 910 indicates a gate electrode comprising polycrystalline silicon, 911 indicates a gate insulator comprising a silicon oxide film, and 912 indicates an N well comprising an N-type impurity of a low concentration. The P-type MOS transistor is formed by the source 98, the drain 99, the gate electrode 910, the gate insulator 911 and the N well 912.

There are provided field oxides comprising the silicon oxide film $SiO_2$ for isolation in which the formation is made for 913 on the P well 97, for 914 with riding on both of the P well 97 and the N well 912, and for 915 on the N well 913, respectively.

By the way, in the present invention, the region of the single crystal silicon in which the N-type MOS transistor is formed is referred to as the P well, and the region of the single crystal silicon in which the P-type MOS transistor is formed is referred to as the N well. The P well comprises the P-type impurity of the low concentration in accordance with the ion implantation or the like, however, if the single crystal silicon at the thin side of the SOI wafer comprises the P-type impurity, and even when no P-type impurity is introduced into the region in which the N-type MOS transistor is formed by means of the ion implantation or diffusion, provided that there is given a region in which the N-type MOS transistor is formed, this region is also called the P well in the present invention. This is the same for the N well.

In FIG. 9, the bottoms of the source 93 and the drain 94 of the N-type MOS transistor do not contact with the BOX 92. Thus, in the structure of the N-type MOS transistor of the present invention shown in FIG. 9, the parasitic channel generated at the boundary 314 between the P well 37 and the BOX 32 as explained in FIG. 3 is not generated.

In addition, in FIG. 9, the bottoms of the source 98 and the drain 99 of the P-type MOS transistor do not contact with the BOX 92. At the same time, there is no contact with the BOX 92 together with the bottoms of the field oxides 913, 914 and 915.

Figure 10:
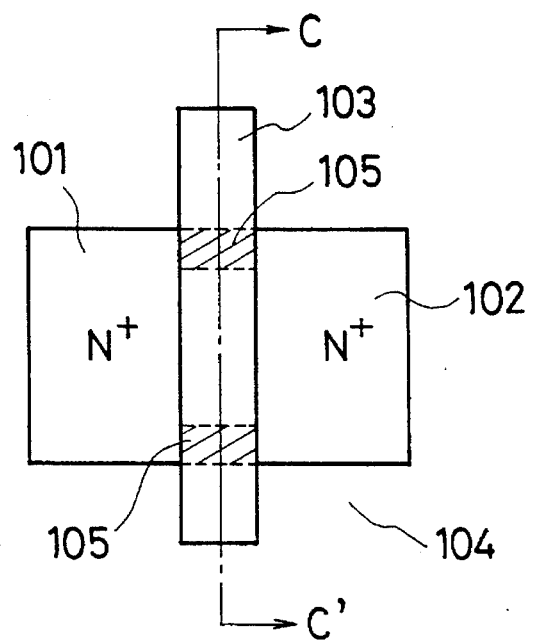
FIG. 10 is a plan view of the N-type MOS transistor formed on the SOI wafer.

FIG. 10 shows a plan view of an N-type MOS transistor formed on the BOX. 101 and 102 indicate a source and a drain of an N-type MOS transistor respectively, and 103 indicates a gate comprising polycrystalline silicon containing an N-type impurity at a high concentration. In FIG. 10, the portion 104 other than the source 101, the drain 102 and the gate 103 indicates the field oxide comprising the thick oxide film.

Figure 11:
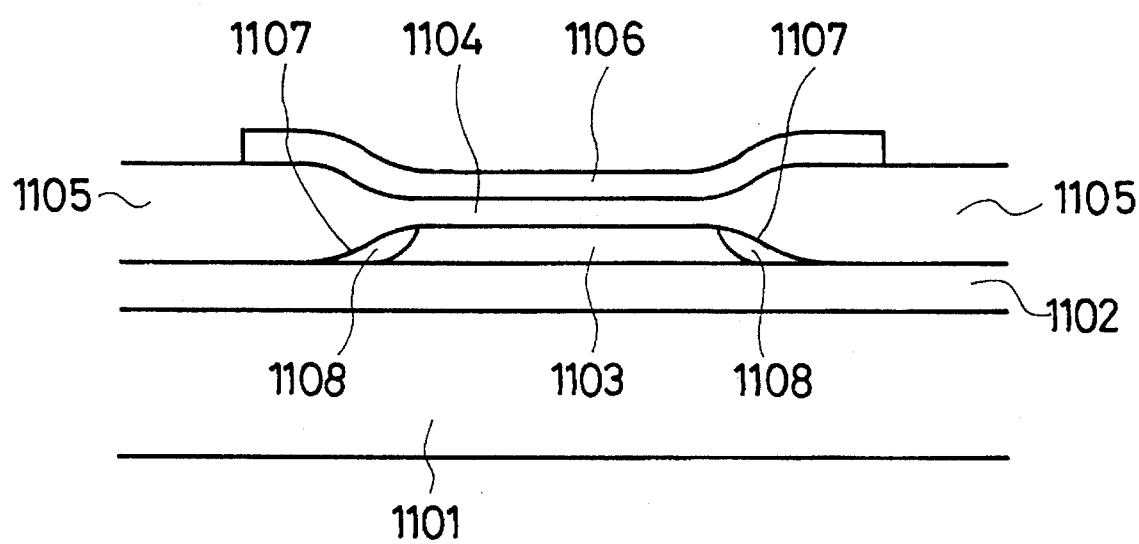
FIG. 11 is a cross-sectional view in the widthwise direction of the N-type MOS transistor formed on the SOI wafer.

FIG. 11 shows a cross-sectional view after cutting along the straight line C—C' in FIG. 10 of the N-type MOS transistor when the field oxide contacts with the BOX. 1101 represents a single crystal silicon substrate of a thickness of 500 to 700 μm of a SOI wafer, 1102 represents a BOX of a thickness of about several hundred Å to several μm, 1103 represents a P well comprising a P-type impurity of a low concentration, 1104 represents a gate insulator comprising a silicon oxide, 1105 represents a field oxide comprising a silicon oxide of a thickness of about 0.5 to 1 μm, and 1106 represents a gate comprising polycrystalline silicon containing an N-type impurity of a high concentration. A source and a drain exist at frontward location and backward location in the direction perpendicular to the plane of the paper, and the direction of current also exists in the direction perpendicular to the plane of the paper.

The end portion of the field oxide 1105 is usually formed into a taper shape, and the portion 1107 is called the bird's beak. After the formation of the field oxide 1105, a single crystal silicon layer 1108 having an extremely thin thickness is formed under the bird's beak 1107.

As the P-type impurity for forming the P well, boron is usually used. When the single crystal silicon is oxidized, the boron having been present in the vicinity of the silicon surface is subject to be incorporated into the silicon oxide film rather than remains in the silicon, Thus, when the field oxidation is performed, a considerable amount of boron at the portion 1108 of the single crystal silicon under the bird's beak is absorbed by the field oxide 1105. Thus, the concentration of boron at the portion 1108 of the single crystal silicon of the thin thickness under the bird's beak is considerably thinner than the concentration of boron in the region of the P well immediately under the gate oxide 1104.

Usually, in the case of the MIS field effect transistor (MISFET), the portion in which the current flow called the channel, which exists immediately under the gate insulator. In the case of the N-type MOS transistor, when the boron concentration at the channel portion is high to some extent, the gate voltage for forming the channel (hereinafter abbreviated as the $V_{TM}$) is high in accordance therewith.

However, in the N-type MOS transistor formed on the SOI wafer, as shown in FIG. 11, if the bottom of the field oxide 1105 contacts with the BOX 1102, the portion 1108 in which the boron concentration is extremely low is generated, and the portion has a low $V_{TM}$, and if the bottoms of the source 101 and the drain 102 contact with the BOX 1102, the portion 1108 in which the boron concentration is low newly serves as a current passage.

The portion 1108 under the bird's beak shown in FIG. 11 corresponds to 105 shown by the inclined line in FIG. 10. The parasitic channel is generated at the portion 105 at the end portion in the widthwise direction of the N-type MOS transistor, and the leak current increases.

Figure 12:
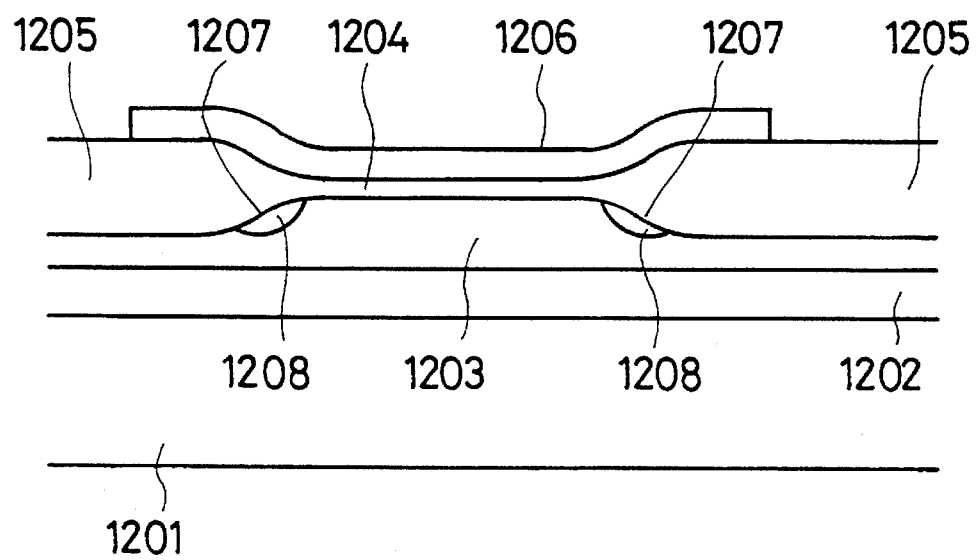
FIG. 12 is a cross-sectional view in the widthwise direction of the N-type MOS transistor in the semiconductor device of the present invention shown in FIG. 9.

In the example of the present invention shown in FIG. 9, the bottoms of the field oxides 913, 914 and 915 do not contact with the BOX 92. FIG. 12 shows a cross-sectional view in the widthwise direction of the N-type MOS transistor cutting along the straight line D—D' passing through the N-type MOS transistor in FIG. 9 showing the example of the present invention. 1201 represents a single crystal silicon substrate of a thickness of 500 to 700 μm of a SOI wafer, 1202 represents a BOX of a thickness of about several hundred Å to several μm, 1203 represents a P well comprising a P-type impurity of a low concentration, 1204 represents a gate insulator comprising a silicon oxide, 1205 represents a field oxide comprising a silicon oxide of a thickness of about 0.5 to 1 μm, and 1206 represents a gate comprising polycrystalline silicon containing an N-type impurity of a high concentration. A source and a drain exist at frontward location and backward location in the direction perpendicular to the plane of the paper, and the direction of current also exists in the direction perpendicular to the plane of the paper.

1207 indicates a bird's beak. In FIG. 12, the bottom of the field oxide film 1205 does not contact with the BOX 1202. Namely, the single crystal silicon layer of a certain thickness remains under the bird's beak 1207. Thus, the concentration of boron as the P-type impurity for forming the P well immediately under the bird's beak, to which boron is supplied from the interior of the P well at the side lower than the region of 1208 immediately under the bird's beak during the oxidation for forming the field oxide 1205, is considerably higher than the boron concentration in the region 1108 immediately under the bird's beak when the bottom of the field oxide film in FIG. 11 contacts with the BOX. Thus, in the semiconductor device of the present invention shown in FIG. 9 in which the bottom of the field oxide film does not contact with the BOX, the parasitic channel generated at the both end portions in the widthwise direction of the N-type MOS transistor as explained in FIG. 10 and FIG. 11 is not formed.

Figure 13:
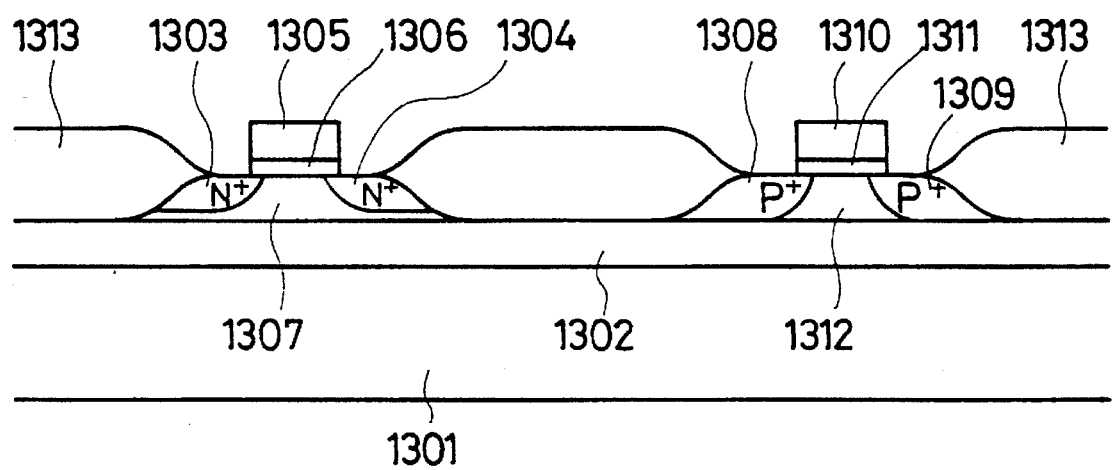
FIG. 13 shows the cross-sectional structure showing another example of the semiconductor device in accordance with the present invention.
Figure 14:
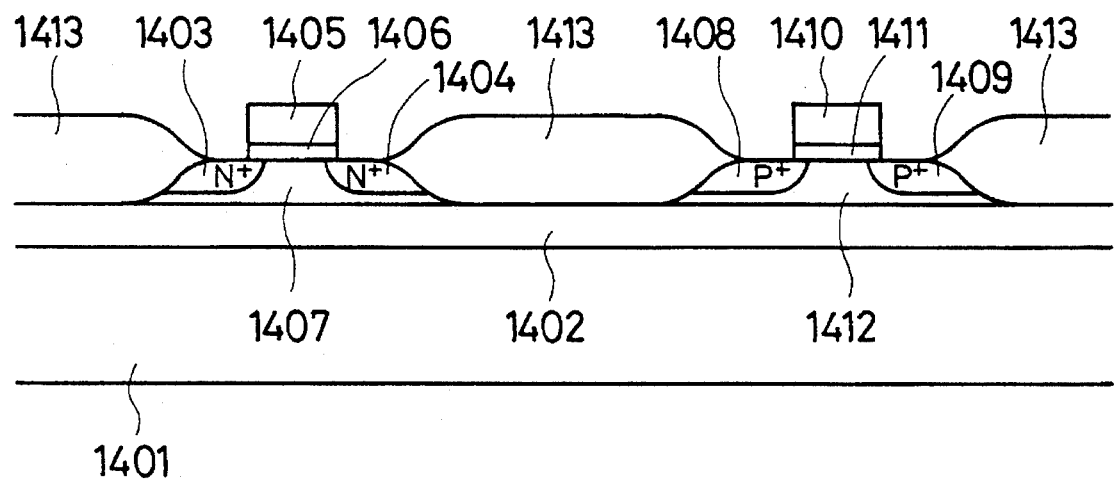
FIG. 14 shows the cross-sectional structure of another example of the semiconductor device in accordance with the present invention.

FIG. 13 and FIG. 14 are figures of cross-sectional structure of partial portions of the CMOSIC formed on the SOI wafer showing other examples of the present invention, respectively. 1301, 1401 indicate single crystal silicon substrates having a thickness of 500 to 700 μm, 1302, 1402 indicate BOX's having a thickness of several hundred Å to several μm, 1303, 1403 indicate sources of N-type MOS transistors, 1304, 1404 indicate drains of the N-type MOS transistors, 1305, 1405 indicate gate electrodes comprising polycrystalline silicon, 1306, 1406 indicate gate insulators comprising silicon oxides, and 1307, 1407 indicate P wells comprising P-type impurities having a low concentration.

1308, 1408 indicate sources of P-type MOS transistors, 1309, 1409 indicate drains of the P-type MOS transistors, 1310, 1410 indicate gate electrodes comprising polycrystalline, 1311, 1411 indicate gate insulators comprising silicon oxides, and 1312, 1412 indicate N wells comprising N-type impurities having a low concentration. 1313, 1413 are field oxides comprising thick silicon oxides having a thickness of several thousand Å to 1 μm, respectively.

The points in which the examples of the present invention in FIG. 13 and FIG. 14 are different from the example of the present invention in FIG. 9 will be explained hereinafter.

In FIG. 13, all of the bottom of the field oxide 1313 and the bottoms of the source 1308 and the drain 1309 of the P-type MOS transistor contact with the BOX 1302, however, the bottoms of the source 1303 and the drain 1304 of the N-type MOS transistor do not contact with the BOX 302. Provided that the bottoms of the source and the drain of the N-type MOS transistor do not contact with the BOX, even when the bottom of the field oxide film 1313 contacts with the BOX, the parasitic channel is not generated at the both end portions in the widthwise direction of the N-type MOS transistor. Even when the bottoms of the source and the drain of the P-type MOS transistor contact with the BOX, the parasitic channel is not generated in the P-type MOS transistor, and the leak current is suppressed to be low, which is as described above.

In FIG. 14, the bottom of the field oxide 1413 contacts with the BOX 1402, however, all of the bottoms of the source 1403 and the drain 1404 of the N-type MOS transistor and the bottoms of the source 1408 and the drain 1409 of the P-type MOS transistor do not contact with the BOX 1402. Also in this case, in the same manner as explained in the example of the present invention in FIG. 13, the parasitic channel is not generated in both of the N-type MOS transistor and the P-type MOS transistor, and the leak current is suppressed to be low.

Figure 15:
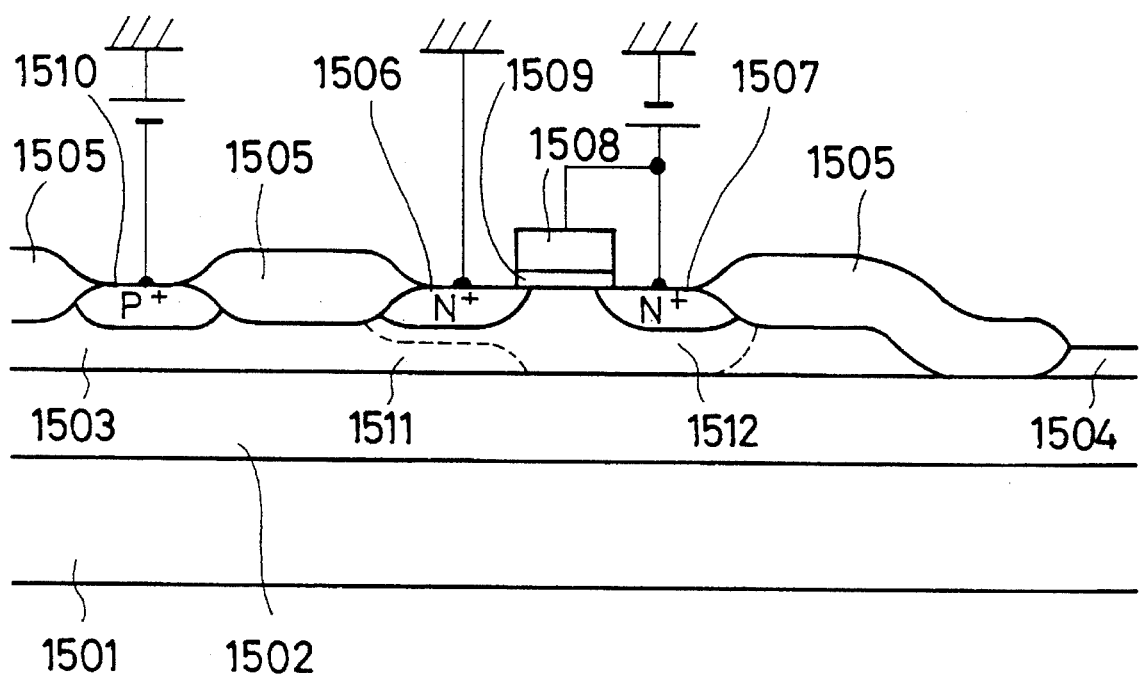
FIG. 15 shows the cross-sectional structure showing one example of the operation method of the semiconductor device in accordance with the present invention.

FIG. 15 shows an example of one operation method of the semiconductor device in which the CMOSIC of the present invention is formed. 1501 indicates a semiconductor single crystal silicon substrate, 1502 indicates a BOX comprising a silicon oxide having a thickness of several hundred Å to several μm, 1503 indicates a P well region in which an N-type MOS transistor is formed, and 1504 indicates an N well region in which a P-type MOS transistor is formed. However, in FIG. 15, the P-type MOS transistor is not drawn. In addition, 1505 at three places represents the field oxide film for isolation, and 1506, 1507, 1508 and 1509 represent a source, a drain, a gate electrode comprising polycrystalline silicon, and a gate insulator comprising a silicon oxide, respectively.

1510 indicates a region comprising a P-type impurity of a high concentration provided for fixing the electric potential of the P well 1503 to be a certain value. One operation method of the semiconductor device in which the CMOSIC of the present invention is formed is to apply a negative voltage to the P well region in which the N-type MOS transistor is formed as shown in FIG. 15.

For example, as shown in FIG. 15, the source 1506 of the N-type MOS transistor, is fixed the ground electric potential, to give the same positive electric potential for example 5 volts are appllied to the gate electrode 1508 and the drain 1507, and in order to make the electric potential of the P well to be a negative electric potential, a negative electric potential, for example, −3 V is applied to the region 1510 of the P-type impurity of the high concentration. The boundary of the depletion layer generated at this time is shown by a broken line 1511. By applying the negative electric potential to the P-type impurity region 1510 of the high concentration, as compared with a case in which the electric potential of this region is made 0 V, the region of the depletion layer having the boundary of the broken line 1511 is wide, the capacitances between the source and the substrate, the drain and the substrate and the gate and the substrate become small, and there is given an advantage that the speed of the CMOSIC becomes fast. Especially as shown in FIG. 15, when the bottom of the depletion layer contacts with the BOX 1502, the capacitance between the drain and the substrate further becomes small, and the speed becomes fast.

Figure 16:
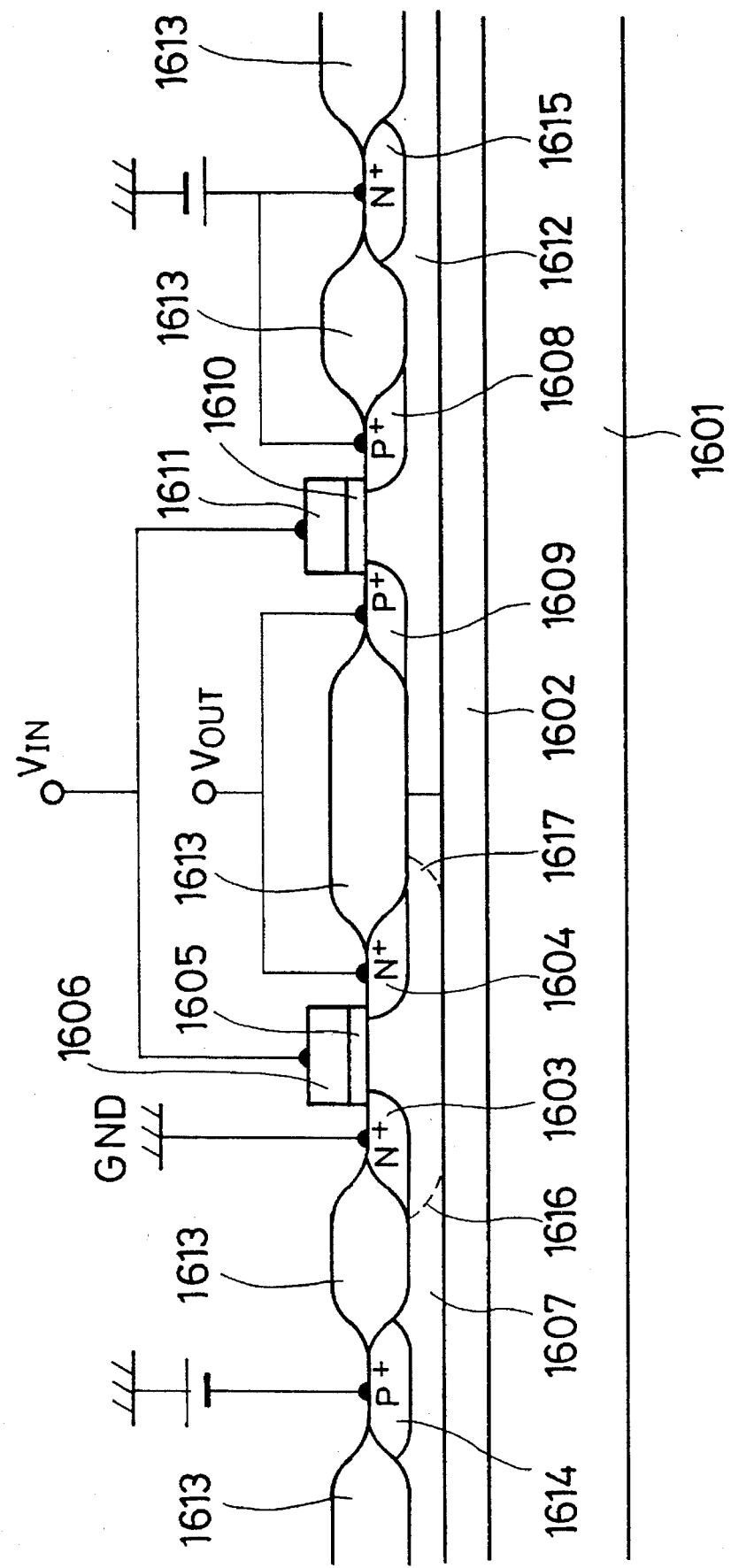
FIG. 16 shows the cross-sectional structure of another example of the operation method of the semiconductor device of the present invention.

In the same manner, FIG. 16 shows an example showing one operation method of the semiconductor device in which the complementary type MOS transistor integrated circuit (CMOSIC) of the present invention is formed, wherein the region in which the N-type MOS transistor is formed has the same thickness of the single crystal silicon as that of the P-type MOS transistor. FIG. 16 shows a figure of cross-sectional structure of an inverter circuit of the CMOSIC. 1601 indicates a semiconductor single crystal silicon substrate, 1602 indicates a BOX having a thickness of several hundred Å to several μm, 1603 and 1604 indicate a source and a drain of an N-type MOS transistor respectively, 1605 indicates a gate insulator comprising a silicon oxide, 1606 indicates a gate electrode comprising polycrystalline silicon, and 1607 indicates a P well formed by a P-type impurity of a low concentration.

In addition, 1608 and 1609 indicate a source and a drain of a P-type MOS transistor respectively, 1610 indicates a gate insulator comprising a silicon oxide, 1611 indicates a gate electrode comprising polycrystalline silicon, and 1612 indicates an N well formed by an N-type impurity of a low concentration.

1613 existing at five places in FIG. 16 indicates the field oxide for isolation comprising a silicon oxide having a thickness of several thousand Å to 1 μm. The P well 1607 contacts with the N well 1612 under the central field oxide. 1614 is a high concentration layer of the P-type impurity formed in the P well in order to fix the electric potential of the P well, and 1615 is a high concentration layer of the N-type impurity formed in the N well in order to fix the electric potential of the N well.

In FIG. 16, the source 1608 of the P-type MOS transistor is electrically connected to the high concentration layer 1615 of the N-type impurity formed in the N well, and for example, an electric source voltage of 5 V is applied from a voltage supply means. In addition, the source 1603 of the N-type MOS transistor is fixed to the ground electric potential, namely 0 V (GND). The gate 1606 of the N-type MOS transistor is electrically connected to the gate 1611 of the P-type MOS transistor to serve as the input terminal. In addition, for example, a negative voltage of −3 V is applied to the high concentration layer 1614 of the P-type impurity formed in the P well. And the drain 1604 of the N-type MOS transistor is electrically connected to the drain 1609 of the P-type MOS transistor to serve as the output terminal.

Now, for example, 0 V is applied to the input terminal as the voltage $V_{in}$, 5 V which is approximately the same as the electric source voltage $V_{DD}$ is outputted from the output terminal as the voltage $V_{OUT}$. Namely, 5 V is applied to the drain 1604 of the N-type MOS transistor. Additionally −3 V is applied to the high concentration layer 1614 of the P-type impurity, and the electric potential of the P well becomes a value near to −3 V. At this time, voltages in the opposite direction are applied as about 3 V between the source 1603 of the N-type MOS transistor and the P well 1607, and as about 8 V between the drain 1604 of the N-type MOS transistor and the P well 1607, and the depletion layer widely extends to the P well side.

In FIG. 16, two broken lines 1616 and 1617 indicate the boundaries of the depletion layer widened at this time. The depletion layer extends to the right side and the upper side of the boundary 1616 and to the left side and the upper side of the boundary 1617.

As also clarified from FIG. 16, when the positive voltage is applied to the drain of the N-type MOS transistor, the depletion layer arrives at the BOX comprising the silicon oxide at the lower side. In this state, the junction capacitance between the source and the P well and between the drain and the P well of the N-type MOS transistor is a capacitance in which the depletion layer is connected in series to the BOX as the thick insulator, which becomes an extremely small value. Further, the capacitance between the gate electrode and the P well also becomes small due to the contact of the depletion layer of the P well with the BOX. As a result, in the complementary type MIS transistor integrated circuit formed on the SOI wafer, according to the operation method of the present invention in which the integrated circuit is operated by applying the negative voltage to the region of the P well in which the N-type MOS transistor is formed therein, the junction capacitance of the source and the drain of the N-type MOS transistor with respect to the silicon substrate (P well) and the capacitance between the gate electrode and the P well become extremely small, and as compared with a case in which the complementary type MIS transistor integrated circuit is formed on an ordinary single crystal silicon wafer which is not the SOI wafer, there is provided an advantage that the integrated circuit can obtain a faster operation speed.

If a plurality of P well regions are formed in an independent and separated manner respectively in the formed complementary type MIS transistor integrated circuit, each of the regions of the P well is provided with a high concentration layer of a P-type impurity such as boron or the like, and a negative electric potential may be applied thereto. Further, when the negative voltage is applied to the P well region, the electric potential of the P well becomes negative, and as compared with a case in which the negative voltage is not applied to the P well, it becomes difficult to operate the MOS transistor in which the BOX is considered as the gate insulator, the thick single crystal silicon substrate at the lower side is considered as the gate electrode, and the boundary between the P well and the BOX is considered as the channel. This transistor acts as the parasitic channel, so that it is desirable that this transistor does not operate.

In addition, in the case of the structure of the SOI wafer of the present invention, owing to the fact that all of the bottoms of the source and the drain of the N-type MOS transistor and the bottom of the field oxide film formed in the P well do not contact with the BOX, it is possible to set the electric potential of the silicon substrate in the P well region to be a desired value. Thus, the mask, which is used when the complementary type MOS transistor integrated circuit (CMOSIC) is formed on an ordinary single crystal silicon wafer which is not the SOI wafer, can be exactly applied to the SOI wafer having the structure of the present invention, and as compared with the case in which the formation is made on the ordinary single crystal silicon, in spite of the equivalent integrated circuit, it is possible to manufacture the excellent integrated circuit in which the speed is fast, and the latch-up as described hereinafter is extremely difficult to occur.

Next, considering a bias condition actually used for the CMOSIC, it will be considered that the depletion layer extending under the drain 1604 contacts with BOX 1602 with what thickness the single crystal silicon on the BOX 1602 is provided. At first, it is assumed that the electric source voltage $V_{DD}$ is 5 V, namely the maximum voltage applied to the drain of the N-type MOS transistor is 5 V, and the substrate bias is −3 V. Next, the P-type impurity concentration in the P well 1607 is $5 \times 10^{14}$ with boron. Usually, it is rare that a P-type substrate having a concentration lower than the above is used. At this time, the depletion layer extends to the P well side by about 4 µm from the bottom of the drain 1604. Therefore, when the thickness of the single crystal silicon on the BOX 1602 is not more than 4 µm, the bottom of the depletion layer contacts with the BOX 1602, the capacitance between the drain and the substrate becomes extremely small, and the speed of the integrated circuit becomes fast. As described above, the present invention is characterized in that the thickness of the single crystal silicon on the electrically insulating substrate is not more than 4 µm.

In addition, it will be considered that what width depletion layer extends under the drain for the case that the P-type impurity concentration in P-well 1607 becomes higher than $5E14 \text{ cm}^{-3}$ in the previous case. That is, the P-type impurity concentration in P-well 1607 are $5E15 \text{ cm}^{-3}$, $1E16 \text{ cm}^{-3}$ and $5E16 \text{ cm}^{-3}$. It is assumed that electric source voltage is 5 V, namely the maximum voltage applied to the drain of the N-type MOS transistor is 5 V, and the substrate bias is −3 V.

For the three cases in that P-type impurity concentration in P-well 1607 are $5E15 \text{ cm}^{-3}$, $1E16 \text{ cm}^{-3}$ and $5E16 \text{ cm}^{-3}$, the extending depletion layer become 1.5 µm, 1.1 µm and 0.5 µm respectively.

Next, it is assumed that electric source voltage is 5 V, namely the maximum voltage applied to the drain of the N-type MOS transistor is 5 V, and the substrate bias is 0 V.

For the three cases in that P-type impurity concentration in P-well 1607 are $5E15 \text{ cm}^{-3}$, $1E16 \text{ cm}^{-3}$ and $5E16 \text{ cm}^{-3}$, the extending depletion layer become 1.2 µm, 0.9 µm and 0.4 µm respectively.

So, for example, for the case that the P-type impurity concentration in P-well 1607 is 1E16 cm and assumed that the drain depth is 0.3 µm, the single silicon thickness is desirable not more than 1.4 µm, for the case in that substrate bias is −3 V and not more than 1.2 µm, for the case in that substrate bias is 0 V.

In addition, in the case of the structure of the SOI wafer of the present invention, the single crystal silicon layer is not present at all between the field oxide for isolation and the BOX comprising the silicon oxide, or if any, it is merely an extremely thin layer of about several µm. When the bottom of the field oxide contacts with the BOX, the single crystal silicon layer is not present under the field oxide, so that no carrier flows under the field oxide at all. In addition, even when the single crystal silicon layer having an extremely thin thickness of not more than several µm at most remains under the field oxide, the resistance of the single crystal silicon layer is extremely high, and it is difficult to allow carriers such as electrons or holes to flow. Thus, the latch-up, which inherently occurs in the CMOSIC, does not occur at all in the CMOSIC formed on the SOI wafer of the present invention, or is extremely difficult to occur.

By our experiments, for the case that minimum single silicon thickness under isolation region becomes thicker than 2 µm, the latch up can occur. However, for the case that minimum single silicon thickness under isolation region becomes thinner than 2 µm, the latch up can not occur. So, the minimum single silicon thickness under isolation region is desirable less than 2 µm.

In the above-mentioned discussion, the semiconductor device of the present invention has been explained for the semiconductor device in which only the CMOSIC is formed on the SOI wafer, however, the present invention is not limited to those in which the IC formed on the SOI wafer is the CMOSIC, which can be applied to BiCMOSIC (bipolar CMOSIC) in which a bipolar IC or the like is formed together with the CMOSIC and the like.

Figure 2:
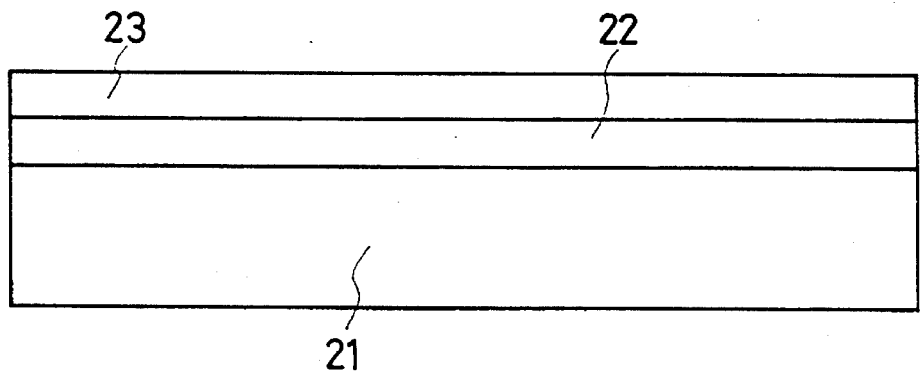
FIG. 2 shows the cross-sectional structure of the conventional conventional SOI wafer.

By the way, at present, among SOI wafers in which the semiconductor single crystal silicon is used, there are two types of wafers mainly used. In one of them, ion implantation of oxygen is performed into a single crystal silicon substrate to give a certain depth, and then annealing is performed, thereby it is possible to form the SOI wafer having the structure shown in FIG. 2. This SOI wafer is called SIMOX (Separation by Implantation of Oxygen). This wafer has an advantage that the dispersion of the silicon thickness of the SOI layer in the wafer is extremely small. However, in the case of this SIMOX wafer, unless the thickness of the SOI silicon layer is not more than about 0.2 µm, the SOI layer does not have good single crystal silicon characteristics after the annealing.

For example, in the case of this SIMOX wafer, after annealing, dislocation density less than 500/cm$^2$ in single silicon layer on the silicon oxide, can not be got easily. Moreover, silicon oxide in SIMOX wafer has not yet been got good characteristics as insulator, that silicon oxide generated by therminal oxidation has.

When the thickness of the single crystal silicon of the SOI layer is thin as described above, the bottoms of sources and drains of both of an N-type MOS transistor and a P-type MOS transistor contact with the BOX, and it is difficult to provide the structure of the present invention as shown in FIG. 1. When the SIMOX wafer is used, without providing the structure of the present invention by force, the high speed property can be obtained with the structure of the conventional semiconductor device shown in FIG. 3.

The present invention has a feature that the SOI wafer formed by the bonded wafer as described hereinafter is used.

The manufacturing method of the bonded wafer will be shown in accordance with FIG. 17(a) to (d).

Figure 17A:
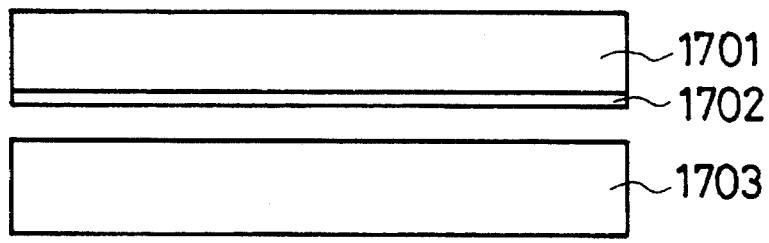
FIGS. 17(a–(d) show cross-sectional views in the order of production steps showing the production method of the bonded SOI wafer.

In FIG. 17(a), one single crystal silicon substrate 1701 has one surface which has been subjected to thermal oxidation to form a silicon oxide 1702. The other one single crystal silicon substrate 1703 has not been subjected to thermal oxidation.

Figure 17B:
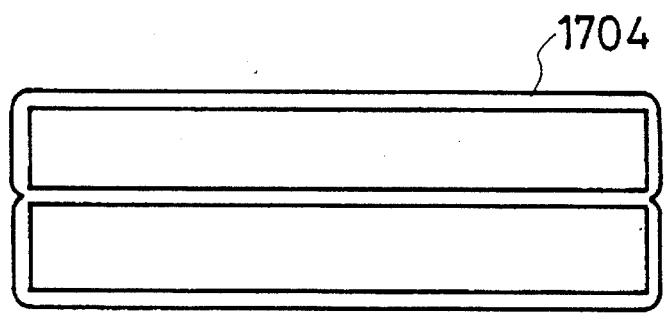

In FIG. 17(b), the above-mentioned two single crystal silicon substrates are bonded with each other with interposing the silicon oxide 1702 at the inside in an oxygen atmosphere at a high temperature of 1100° C. to 1200° C. The circumference of the two single crystal silicons is oxidized, and a silicon oxide having a thickness of about 1 µm is formed.

Figure 17C:
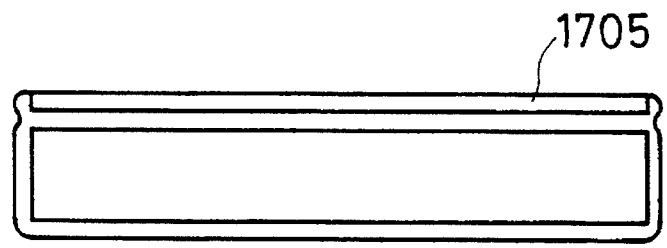
Figure 17D:
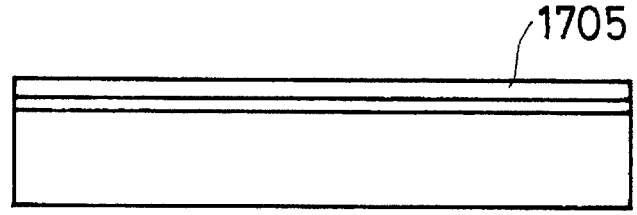

In FIG. 17(c), the single crystal silicon substrate 1701 is polished into a desired thickness to form a thin single crystal silicon layer (SOI layer) 1705. Further, as shown in FIG. 17(d), the silicon oxide film 1704 around the single crystal silicon substrate is removed, and the bonded SOI wafer is completed. However, as shown in FIG. 17(c), even in the state in which the silicon oxide film having a thickness of about 1 m is attached around the single crystal silicon substrate, the use is of course possible as the bonded SOI wafer. In this case, the warp of the wafer is smaller than that of the wafer shown in FIG. 17(d). Thus, in the step for making the semiconductor IC, especially in the photolithography step, it becomes possible to perform uniform exposure and development in the wafer, which is convenient to obtain products with a high yield.

With respect to this bonded SOI wafer, usually the thin single crystal silicon layer 1705 for forming the element has the dispersion of the silicon thickness of, for example, about ±0.3 µm in the wafer. With this wafer, it is impossible to form the IC of the conventional structure shown in FIG. 3 in which the CMOSIC is formed in the SOI wafer.

Namely, there is a case in which the single crystal silicon layer 1705 is not present at all at some places in the wafer, and there is a case in which the thickness of the single crystal silicon layer 1705 is too thick at other places in the wafer to make it impossible to allow the bottoms of the sources and the drains of both of the N-type MOS transistor and the P-type MOS transistor to contact with the BOX, so that the yield of IC becomes extremely low.

With respect to the semiconductor device of the structure of the present invention, in the case of this bonded wafer, when the thickness of the semiconductor silicon layer 1705 is made about 1.0 µm as an average value in the wafer,-there is given dispersion in thickness of 0.7 to 1.3 µm in the wafer. However, even when the dispersion in thickness is present, it is possible to form the semiconductor devices having the structures shown in FIG. 1, FIG. 6, FIG. 9, FIG. 13 and FIG. 14 of the present invention, and in the case of any one of the structures, it is possible to form the CMOSIC in which the speed is fast and latch-up does not occur. In addition, the SIMOX wafer is produced one by one using a lengthy ion implantation process. Therefore, mass-productivity is poor, and the price is more expensive than that of the bonded wafer by about 4 times. Also from this fact, it can be said that the bonded wafer is a suitable wafer for the semiconductor device of the present invention.

In the case of this bonded SOI wafer, dislocation density less than 500/cm$^2$ in a single silicon layer on the thermal silicon oxide, can be very easily achieved. Moreover, as silicon oxide in this bonded SOI wafer is a thermal oxide, it is needless to say that this silicon oxide has good characteristics as insulator.

Figure 18:
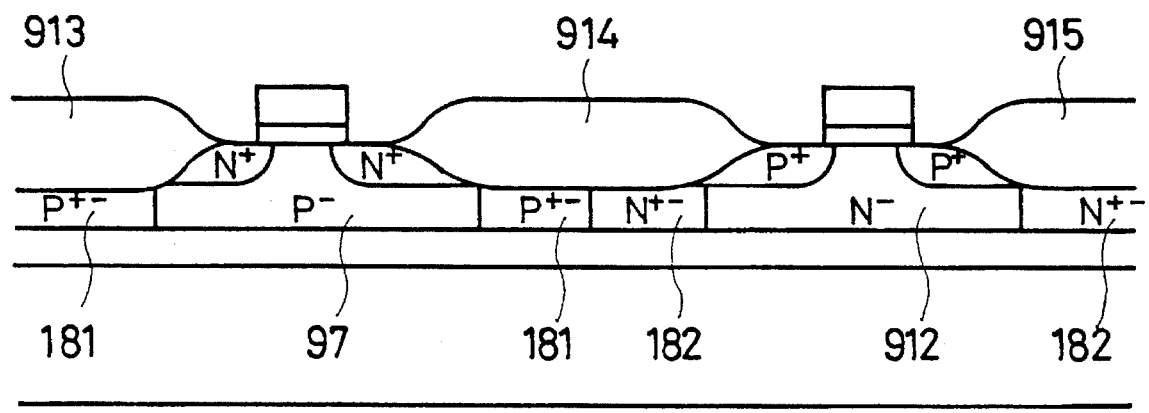
FIG. 18 shows the cross-sectional structure of the semiconductor device in accordance with the present invention.

The method of isolation in the semiconductor device of the present invention will now be described. FIG. 18 is a cross-section of the structure showing one example in relation to the isolation method for the semiconductor device of the present invention. The example of the present invention in FIG. 18 resembles the example of the present invention in FIG. 9, and the designation of each portion shown in FIG. 9 can be exactly used also in FIG. 18.

In FIG. 18, 913, 914 and 915 indicate field oxides comprising thick silicon oxides for isolation. 97 is a P well which is the region in which an N-type MOS transistor is formed. The concentration of a P-type impurity, for example, boron in the P well 97 is dilute, which is about $1\times10^{16}$ cm$^{-3}$.

912 is an N well which is the region in which a P-type MOS transistor is formed therein. The concentration of an N-type impurity, for example, phosphorous in the N well 912 is about $1\times 10^{16}$ cm$^{-3}$ in the same manner as the P well 97.

181 is a thin single crystal silicon layer comprising a P-type impurity of a relatively high concentration existing under the field oxide 913 and the left half of the field oxide 914. 181 is the region in which the P well 97 continues, however, the concentration of the P-type impurity is made high to the degree of, for example, $1\times10^{17}$ cm$^{-3}$. In addition, 182 is a thin single crystal silicon layer comprising an N-type impurity of a relatively high concentration existing under the field oxide 915 and the right half of the field oxide 914. 182 is the region which continues the N well 912, however, the concentration of the P-type impurity is made high to be a degree of, for example, $1\times10^{17}$ cm$^{-3}$.

The high concentration P well region of 181 and the high concentration N well region of 182 are single crystal silicon layers of the isolation region, in which owing to the high impurity concentration, it becomes difficult to invert the surface of the single crystal silicon layer as the boundary between the field oxide and the single crystal silicon layer therein, providing the characteristic as being difficult to serve as the current passage. As a result, the electric isolation between the N-type MOS transistor and the P-type MOS transistor existing at both sides of the field oxide 914, and the excellent isolation structure is provided in the semiconductor device of the present invention shown in FIG. 18.

Figure 19:
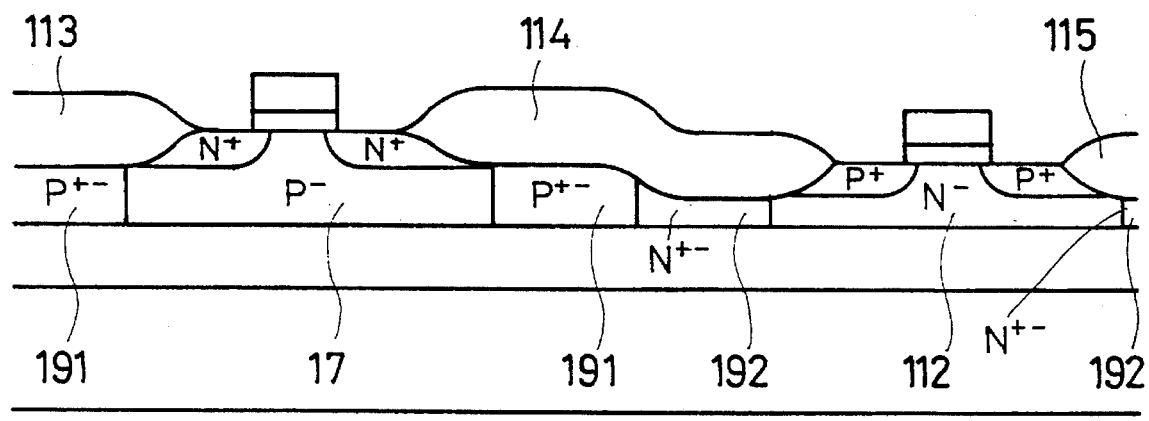
FIG. 19 shows the cross-sectional structure of the semiconductor device in accordance with the present invention.
Figure 20:
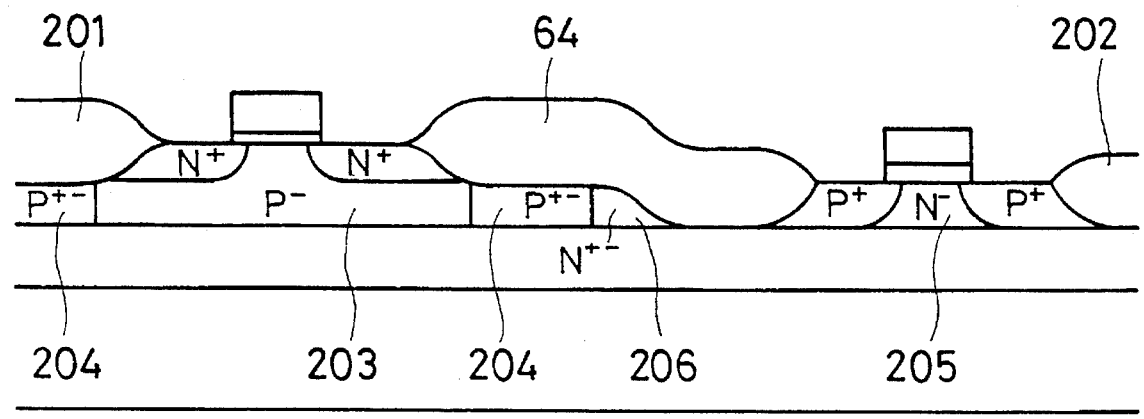
FIG. 20 shows another cross-sectional structure of the semiconductor device in accordance with the present invention.

FIG. 19 and FIG. 20 are cross-sections of structures showing other examples in relation to the element isolation method for the semiconductor device of the present invention. FIG. 19 resembles the example of the present invention in FIG. 11, and FIG. 18 resembles that in FIG. 6, as the designation of each portion in FIG. 19 and FIG. 20, the designation used in FIG. 11 and FIG. 6 respectively is exactly used.

In FIG. 19 and FIG. 20, the action of high concentration p wells of 191 and 204 and high concentration N wells of 192 and 206 is the same as the action of the high concentration P well 181 and the high concentration N well 183 explained in FIG. 18, respectively. Thus, in the semiconductor devices of the present invention having the structures in FIG. 19 and FIG. 20 as the examples of the present invention, it becomes difficult to form the current passage between the N-type MOS transistor and the P-type MOS transistor existing at both sides of the field oxide 114 in FIG. 20 and at both sides of the field oxide 64 in FIG. 20, the electric isolation becomes complete, and there is provided the structure having the excellent isolation structure.

Next, another method of element isolation in the semiconductor device of the present invention will be explained.

Figure 21:
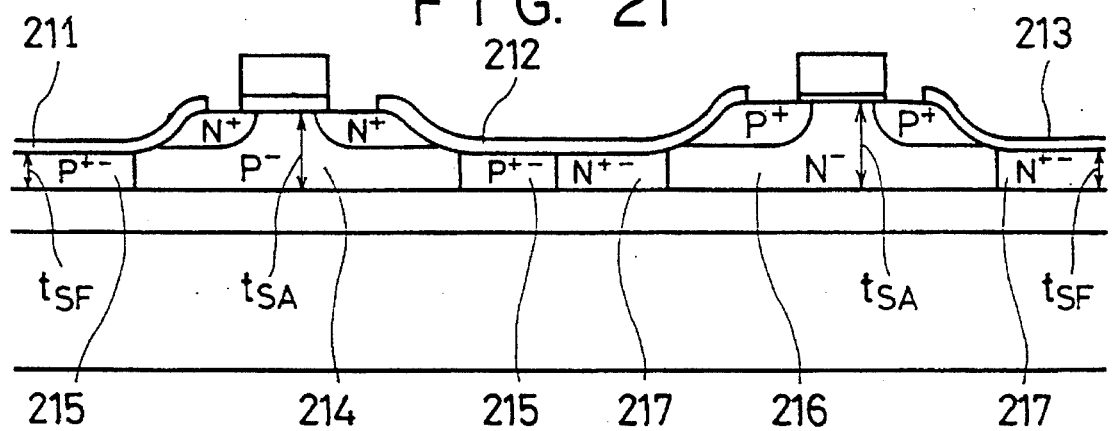
FIG. 21 shows another cross-sectional structure of the semiconductor device in accordance with the present invention.
Figure 22:
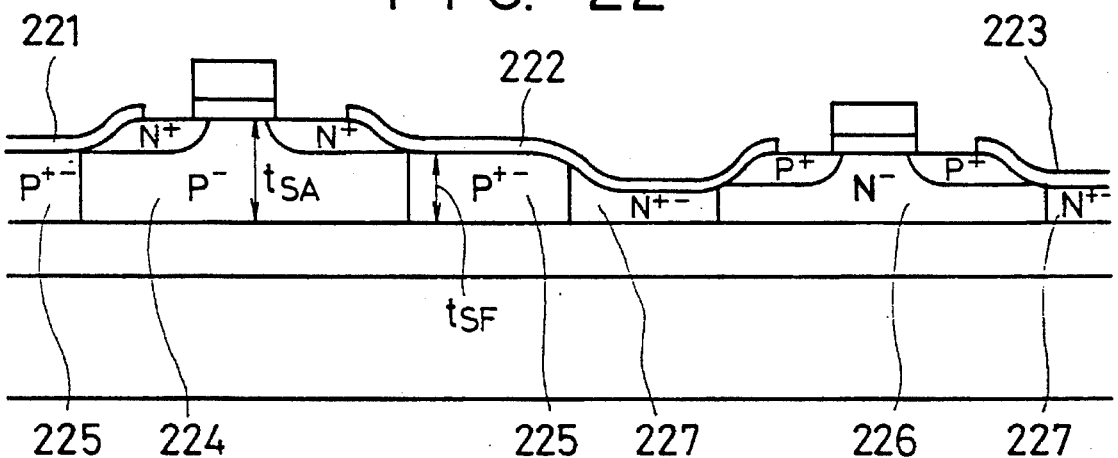
FIG. 22 shows another cross-sectional structure of the semiconductor device in accordance with the present invention.
Figure 23:
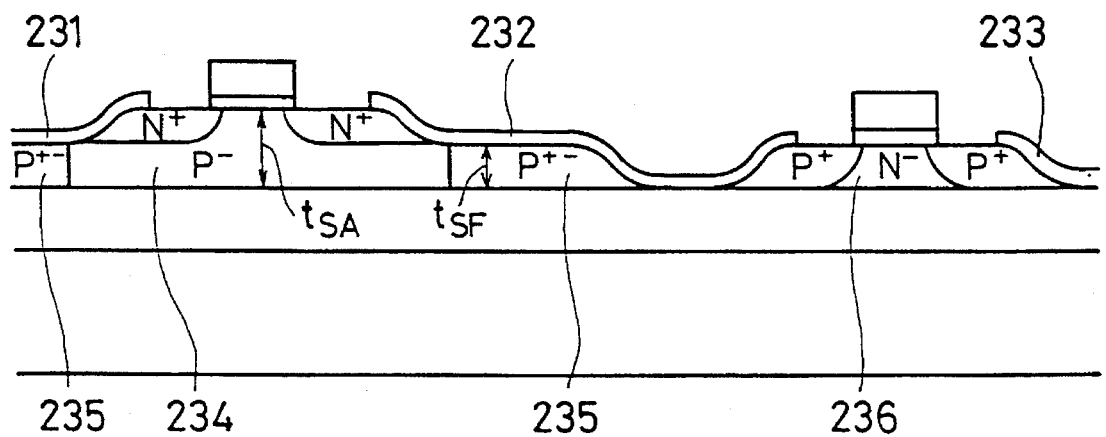
FIG. 23 shows another cross-sectional structure of the semiconductor devices in accordance with the present invention.

Examples of the present invention in FIG. 21, FIG. 22 and FIG. 23 have structures which closely resemble those of the examples of the present invention shown in FIG. 18, FIG. 19 and FIG. 20 respectively, and hence the explanation of the designations of common portions will be omitted.

In FIG. 21, FIG. 22 and FIG. 23, 214, 224 and 234 indicate P wells comprising P-type impurities of a concentration of about $1\times10^{16}$ cm$^{-3}$, 215, 225 and 235 indicate P wells comprising P-type impurities of a relatively high concentration, for example, a concentration of about $1\times10^{17}$ cm$^{-3}$, 216, 226 and 236 indicate N wells comprising N-type impurities of a concentration of about $1\times10^{16}$ cm$^{-3}$, and 217 and 227 indicate N wells comprising N-type impurities of a relatively high concentration, for example, a concentration of about $1\times10^{17}$ cm$^{-3}$.

The points in which the semiconductor devices of the present invention shown in FIG. 21, FIG. 22 and FIG. 23 are different from the semiconductor devices of the present invention shown in FIG. 18, FIG. 19 and FIG. 20 are that in the isolation region, the latter has comprised the thick oxide, whereas in the former, as shown by 211, 212, 213, 221, 222, 223, 231, 232 and 233, they comprise a thin insulation film of, for example, about several hundred to 1000 Å.

Namely, the isolation region for the adjacent N-type MOS transistor and the P-type MOS transistor is the regions of the P well region 215 of the high concentration and the N well region 217 of the high concentration in FIG. 21. In FIG. 22, the isolation region is the regions of the P well region 225 of the high concentration and the N well region 227 of the high concentration. In addition, in FIG. 23, the isolation region is the region of the P well region 235 of the high concentration.

In FIG. 21, the thickness of the single crystal silicon layer of the P well 214 and the N well 216 in which the N-type MOS transistor and the P-type MOS transistor are formed is $t_{SA}$.

In FIG. 22 and FIG. 23, the thickness of the single crystal silicon layer of the P wells 224 and 234 in which the N-type MOS transistors are formed is tSA.

On the other hand, the thickness of the single crystal silicon layer of the P well 215 of the high concentration and the N well 217 of the high concentration in FIG. 21 and the P wells 225 and 235 of the high concentration in FIG. 22 and FIG. 23 is t. t is smaller than t.

For example, when the value of tSA is about 1 μm, $t_{SA}$ is 0.1 to 0.5 μm to be extremely small. As described above, the thickness of the single crystal silicon layer in the element isolation region is extremely thin in the semiconductor device of the present invention, so that the resistance is extremely high, and no sufficient current flows between the adjacent transistors. Further, owing to the fact that the impurity concentration of the single crystal silicon layer in the isolation region is relatively high in the semiconductor device of the present invention, there is provided the structure in which the inversion layer is difficult to be generated on the surface of the single crystal silicon, and also from this fact, no sufficient current flows between the adjacent transistors.

Figure 24:
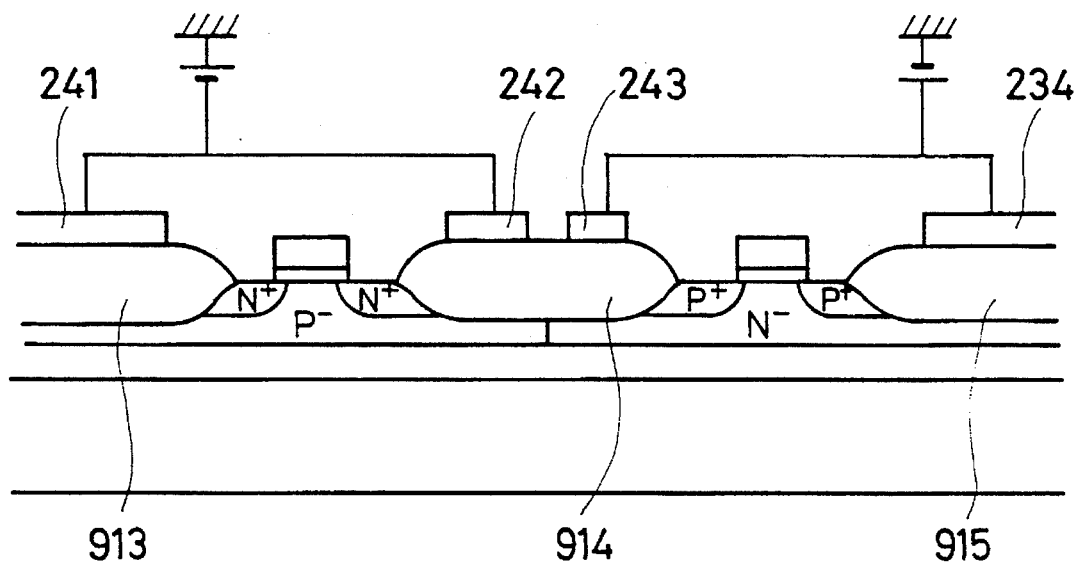
FIG. 24 shows the cross-sectional structure showing the voltage condition for adding the isolation region of the semiconductor device in accordance with the present invention.

As described above, as being different from the examples of the present invention shown in FIG. 18, FIG. 19 and FIG. 20, even when the isolation region is not formed by the thick oxide, the semiconductor devices of the present invention shown in FIG. 21, FIG. 22 and FIG. 23 can sufficiently realize the element isolation. In FIG. 24, another example of the semiconductor device of the present invention is further shown. The structure in FIG. 24 closely resembles the structure of the semiconductor device of the present invention shown in FIG. 9, so that the explanation for the designations of common portions will be omitted.

In FIG. 24, 913, 914 and 915 indicate field oxides comprising thick silicon oxides, 241, 242, 243 and 244 indicate polycrystalline silicon in which an impurity such as phosphorus or the like of not less than $1\times10^{20}$ cm$^{-3}$ is contained. This may be a metal such as aluminum or the like. A negative voltage is applied to the polycrystalline silicons 241 and 242 existing on the left half of 914 and the field oxide 913 comprising the thick silicon oxide. In addition, a positive voltage is applied to the polycrystal silicons 243 and 244 existing on 915 and the right half of the field oxide 914 comprising the thick silicon oxide. By applying the voltage as described above, immediately under the field oxide of the left half of 914 and 913, the P-type impurity for forming the P well is accumulated, and immediately under the field oxide film of 915 and the right half of 914, the N-type impurity for forming the N well is accumulated.

By doing so, the electron, which is the carrier for the N-type MOS transistor formed in the P well, cannot proceed under the field oxide film 913 and under the left half of 914. On the other hand, the hole, which is the carrier for the P-type MOS transistor formed in the N well, cannot proceed under the right half of the field oxide film 914 and under 915. Thus the electric isolation between the adjacent transistors is ensured.

Figure 25:
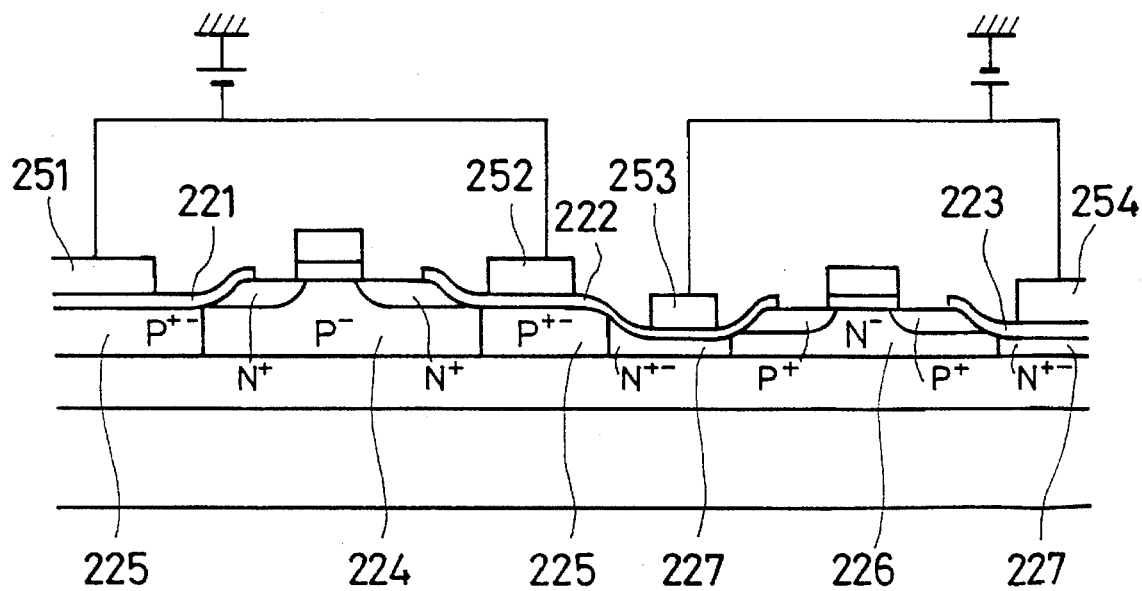
FIG. 25 shows the cross-sectional structure showing the voltage condition for adding the element isolation region of the semiconductor device in accordance with the present invention.

FIG. 25 shows another example of the semiconductor device of the present invention. The structure in FIG. 25 closely resembles the structure of the semiconductor device of the present invention shown in FIG. 22, so that the explanation for the designations for common portions will be omitted.

In FIG. 25, 251, 252, 253 and 254 indicate polycrystalline silicon in which an impurity such as phosphorus or the like is contained by not less than $1\times10^{20}$ cm$^{-3}$. This may be a metal such as aluminum or the like. A negative voltage is applied to the polycrystalline silicons 251 and 252 existing on the left half of 222 and the thin insulation film 221. In addition, a positive voltage is applied to polycrystalline silicons 253 and 254 existing on 223 and the right half of a thin insulation film 222. By applying the voltage as described above, immediately under the insulation film of the left half of 224 and 221, the P-type impurity for forming the P well is accumulated, and immediately under the insulation film of 223 and the right half of 222, the N-type impurity for forming the N well is accumulated.

By doing so, the electron, which is the carrier for the N-type MOS transistor formed in the P well, cannot proceed under the insulation film 221 and under the left half of the insulation film 222. On the other hand, the hole, which is the carrier for the P-type MOS transistor formed in the N well, cannot proceed under the right half of the insulation film 222 and under 223. Thus, even when the insulation films 221, 222 and 223 are thin, the electric isolation between the adjacent transistors is further ensured.

In FIG. 24 and 25, the voltage is applied to the polycrystalline silicon existing both on the insulation films over P-well and N-well. In the present invention, the voltage may be applied to the polycrystalline silicons existing either on the insulation films ove P-well and N-well.

By the way, as described above, the present invention is characterized in that the complementary type MOS transistor is operated by applying the negative voltage to the P well in which the N-type MOS transistor is formed. Usually, when the negative voltage is applied to the P well region in which the N-type MOS transistor is formed, for the formation of the current passage formed on the silicon surface between the source and the drain, the necessary gate voltage ($V_{th}$) becomes high as compared with the case of taking the ground electric potential of the P well region.

However, for example, if the single crystal silicon under the field oxide film 1505 shown in FIG. 15 is too thin, even when there is given the application of the negative voltage of the high concentration P-type impurity region 1510 as the substrate terminal, no negative voltage is applied to the P well immediate under the drain 1507, the source 1506 and the gate insulation film 1509 in which the N-type MOS transistor is formed, and $V_{th}$ has no great difference from $V_{th}$ when the P well is in 0 V, which does not become high. According to experiment results, it has been revealed that when the silicon thickness immediately under the field oxide film 1505 in FIG. 15 is not less than 0.1 μm, and when the negative voltage is applied to the high concentration P-type impurity region 1510, the negative voltage is applied to the P well region under the gate insulator 1509, the drain 1507 and the source 1506 of the N-type MOS transistor, and in the case of a thickness of not more than the above, no negative voltage is applied.

According to this fact, in the present invention, the feature of not less than 0.1 μm is provided for the thickness $t_{SF}$ of the single crystal silicon under the left half of 114 and the silicon oxide film 113 shown in FIG. 1, the thickness $t_{SF}$ of the single crystal silicon under the left half of the field oxide 64 shown in FIG. 6, the thickness $t_{SF}$ of the single crystal silicon under the field oxides 913, 914 and 915 shown in FIG. 9, the thickness tSF of the single crystal silicon under the thin insulation films 211, 212 and 213 shown in FIG. 21, the thickness tSF of the single crystal silicon under the left half of 222 and under the insulation film 221 shown in FIG. 22, and the thickness tSF of the single crystal silicon under the left half of the thin insulation film 232 and under the thin insulation film 231 shown in FIG. 23.

The semiconductor device of the present invention, which is provided with the above-mentioned advantages, is extremely excellent from a viewpoint of its industrial applicability.

What is claimed is:

1. A semiconductor device, comprising: an integrated circuit having complementary type metal insulator semiconductor transistors, the integrated circuit being formed in a semiconductor single crystal silicon layer provided on an electrically insulating layer, the semiconductor single crystal silicon layer having at least a first region where an N-type MIS transistor is formed and a second region where a P-type MIS transistor is formed, wherein a thickness of the first region is different from a thickness of the second region in the semiconductor single crystal silicon layer.

2. The semiconductor device according to claim 1; wherein the thickness of the first region is larger than the thickness of the second region in the semiconductor single crystal silicon layer.

3. The semiconductor device according to claim 1; wherein the N-type MIS transistor has a source region and a drain region, and at least one of the bottoms of the source region and the drain region is separated from the electrically insulating layer by a predetermined distance to prevent the formation of a parasitic channel.

4. The semiconductor device according to claim 1; further comprising a thick silicon oxide layer for isolation formed around a P-type impurity region of the semiconductor single crystal silicon layer in which the N-type MIS transistor is formed, and a single crystal silicon layer interposed between the thick silicon oxide layer and the electrically insulating layer.

5. The semiconductor device according to claim 4; wherein an impurity concentration in the single crystal silicon layer is higher than that in the semiconductor single crystal silicon layer around which the thick silicon oxide is formed.

6. The semiconductor device according to claim 5; wherein an impurity in the single crystal silicon layer is a P-type impurity.

7. The semiconductor device according to claim 1; further comprising means for applying a negative voltage to the first region of the semiconductor single crystal silicon layer so as to prevent electrical interference between the complementary type metal insulator semiconductor transistors.

8. The semiconductor device according to claim 1; wherein the electrically insulating layer comprises a silicon oxide.

9. The semiconductor device according to claim 1; further comprising a single crystal silicon substrate provided on the electrically insulating layer so as to be opposite to the semiconductor single crystal silicon layer through the electrically insulating layer, wherein a thickness of the single crystal silicon substrate is larger than a thickness of the semiconductor single crystal silicon layer.

10. The semiconductor device according to claim 1; wherein the thickness of the semiconductor single crystal silicon layer is not larger than 4 μm.

11. The semiconductor device according to claim 1; wherein a semiconductor substrate having a structure which has thin single crystal silicon at the upper side with respect to the electrically insulating layer and thick single crystal silicon at the lower side is a bonded semiconductor substrate comprising two single crystal silicon wafers wherein one or both surfaces of the two single crystal silicon wafers is subjected to thermal oxidation to form a silicon oxide for bonding the two single crystal silicon wafers together, and one of the two single crystal silicon wafers is thinned to a desired thickness.

12. The semiconductor device according to claim 1; further comprising an insulating film formed on the semiconductor single crystal silicon layer being provided on the electrically insulating layer to form an isolation region for isolating the N-type MIS transistor and the P-type MIS transistor from each other, and an electrode made of at least one of polycrystalline and metal provided on the insulating film for applying an electric voltage to the electrode so as to prevent an inversion region from being formed in the semiconductor single crystal silicon layer.

13. The semiconductor device according to claim 1; further comprising an insulating film formed on the semiconductor single crystal silicon layer provided on the electrically insulating layer to form an isolation region for isolating the N-type MIS transistor and the P-type MIS transistor from each other, wherein a thickness of the semiconductor single crystal silicon layer is at least 0.1 μm.

14. A semiconductor device comprising: an integrated circuit having complementary type metal insulator semiconductor transistors, the integrated circuit being formed in a semiconductor single crystal silicon layer provided on an electrically insulating layer, the semiconductor single crystal silicon layer having at least a first region where an N-type MIS transistor is formed and a second region where a P-type MIS transistor is formed, wherein a thickness of the first region is the same as a thickness of the second region of the semiconductor single crystal silicon layer, the P-type MIS transistor has a source region and a drain region, the bottoms of both the source region and the drain region of the P-type MIS transistor being in contact with the electrically insulating layer, the N-type MIS transistor has a source region and a drain region, and the bottoms of both the source region and the drain region of the N-type MIS transistor being separated from the electrically insulating layer by a predetermined distance effective to prevent formation of a parasitic channel.

15. The semiconductor device according to claim 14; further comprising a thick silicon oxide layer for isolation formed around a P-type impurity region of the semiconductor single crystal silicon layer in which the N-type MIS transistor is formed, and a single crystal silicon layer interposed between the thick silicon oxide layer and the electrically insulating layer.

16. The semiconductor device according to claim 15; wherein an impurity concentration in the single crystal silicon layer is higher than that in the semiconductor single crystal silicon layer around which the thick silicon oxide is formed.

17. The semiconductor device according to claim 16; wherein an impurity in the single crystal silicon layer is a P-type impurity.

18. The semiconductor device according to claim 14; wherein the electrically insulating layer comprises a silicon oxide.

19. The semiconductor device according to claim 14; further comprising a single crystal silicon substrate provided on the electrically insulating layer so as to be opposite to the semiconductor single crystal silicon layer through the electrically insulating layer, wherein a thickness of the single crystal silicon substrate is larger than a thickness of the semiconductor single crystal silicon layer.

20. The semiconductor device according to claim 14; wherein the thickness of the semiconductor single crystal silicon layer is not larger than 4 μm.

21. The semiconductor device according to claim 14; wherein a semiconductor substrate having a structure which has thin single crystal silicon at the upper side with respect to the electrically insulating layer and thick single crystal silicon at the lower side is a bonded semiconductor substrate comprising two single crystal silicon wafers wherein one or both surfaces of the two single crystal silicon wafers is subjected to thermal oxidation to form a silicon oxide for bonding the two single crystal silicon wafers together, and one of the two single crystal silicon wafers is thinned to a desired thickness.

22. The semiconductor device according to claim 14; further comprising an insulating film formed on the semiconductor single crystal silicon layer provided on the electrically insulating layer to form an isolation region for isolating the N-type MIS transistor and the P-type MIS transistor from each other, wherein a thickness of the semiconductor single crystal silicon layer is at least 0.1 μm.

23. A semiconductor device comprising: an integrated circuit having complementary type metal insulator semiconductor transistors, the integrated circuit being formed in a semiconductor single crystal silicon layer provided on an electrically insulating layer, the semiconductor single crystal silicon layer having at least a first region where an N-type MIS transistor is formed and a second region where a P-type MIS transistor is formed, wherein a thickness of the first region is the same as a thickness of the second region of the semiconductor single crystal silicon layer, the N-type MIS transistor has a source region and a drain region, the bottoms of both the source region and the drain region being separated from the electrically insulating layer by a predetermined distance effective to prevent formation of a parasitic channel; and means for applying a negative voltage to the first type region of the semiconductor single crystal silicon layer so as to prevent electrical interference between the complementary type metal insulator semiconductor transistors.

24. A semiconductor device, comprising: at least one integrated circuit having complementary type metal insulator semiconductors, the integrated circuit being formed in a semiconductor single crystal silicon layer provided on an electrically insulating layer, wherein a thickness of the semiconductor single crystal silicon layer in an isolation region is smaller than a thickness of the semiconductor single crystal silicon layer surrounded by the isolation region; and wherein an impurity concentration in the semiconductor single crystal silicon layer in the isolation region is higher than that in the semiconductor single crystal silicon layer surrounded by the isolation region effective to prevent a flow of current through the isolation region.

25. The semiconductor device according to claim 24; wherein the isolation region comprises an insulating film formed on the semiconductor single crystal silicon layer and an electrode formed on the insulating film for applying an electric voltage to prevent an inversion region from being formed in the semiconductor single crystal silicon layer.

26. The semiconductor device according to claim 24; wherein a thickness of the semiconductor single crystal silicon layer in the isolation region is at least 0.1 μm.

27. A semiconductor device, comprising: an integrated circuit having complementary type metal insulator semiconductor transistors, the integrated circuit being formed in a semiconductor single crystal silicon layer provided on an electrically insulating layer, the semiconductor single crystal silicon layer having at least a first region where an N-type MIS transistor is formed and a second region where a P-type MIS transistor is formed, wherein a thickness of the first region is the same as a thickness of the second region of the semiconductor single crystal silicon layer, the N-type MIS transistor has a source region and a drain region, the bottoms of both the source region and the drain region being separated from the electrically insulating layer by a predetermined distance effective to prevent formation of a parasitic channel; an insulating film formed on the semiconductor single crystal silicon layer being provided on the electrically insulating layer to form an isolation region for isolating the N-type MIS transistor and the P-type MIS transistor from each other; a first electrode provided on the insulating film over the first region for applying a first electric voltage; and a second electrode provided on the insulating film over the second region for applying a second electric voltage having opposite polarity to the first electric voltage so as to prevent an inversion region from being formed in the semiconductor single crystal silicon layer.

\* \* \* \* \*